United States Patent
Balyon

(10) Patent No.: US 9,634,606 B2
(45) Date of Patent: Apr. 25, 2017

(54) OFFSET BUILDING INTEGRABLE PHOTOVOLTAIC STRUCTURES AND ASSEMBLIES HAVING MULTI-CONDUCTOR RETURN LINES

(75) Inventor: Roger Laurentius Balyon, San Jose, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 386 days.

(21) Appl. No.: 13/308,202

(22) Filed: Nov. 30, 2011

(65) Prior Publication Data
US 2013/0133721 A1 May 30, 2013

(51) Int. Cl.
*H01L 31/048* (2014.01)
*H02S 40/30* (2014.01)
(Continued)

(52) U.S. Cl.
CPC ............ *H02S 40/30* (2014.12); *H01L 31/05* (2013.01); *H02S 20/23* (2014.12); *H02S 40/34* (2014.12);
(Continued)

(58) Field of Classification Search
CPC ........... H01L 31/0201; H01L 31/02013; H01L 31/022441; H01L 31/0224; H01L 31/042; H01L 31/0482; H01L 31/0483; H01L 31/0484; H01L 31/0485; H01L 31/0465; H01L 31/05; H01L 31/0504; H02S 20/00; H02S 20/10; H02S 20/20; H02S 20/22; H02S 20/23; H02S 20/25; H02S 40/30; H02S 40/34; H02S 40/36; H02S 30/00; H02S 30/10
See application file for complete search history.

(56) References Cited

U.S. PATENT DOCUMENTS 5,110,370 A * 5/1992 Vogeli et al. ................. 136/256
8,286,393 B2 * 10/2012 Reyal ................ H01L 31/02008
52/173.3
(Continued)

FOREIGN PATENT DOCUMENTS

WO 2009/137347 11/2009
WO 2009/137348 11/2009
(Continued)

*Primary Examiner* — Allison Bourke
*Assistant Examiner* — Edward Schmiedel
(74) *Attorney, Agent, or Firm* — Weaver Austin Villeneuve & Sampson LLP

(57) ABSTRACT

Provided are novel building integrable photovoltaic (BIPV) structures having multiple photovoltaic portions offset with respect to each other along their lengths. An offset direction can correspond to the length of a row of installed BIPV structures. In some embodiments, a BIPV structure may include three offset photovoltaic portions and three corresponding flap portions for extending under photovoltaic portions of adjacent structures and sealing interfaces between installed structures. The novel BIPV structures can facilitate installation, while providing the flexibility to avoid obstacles. Provided also are novel BIPV assemblies having multi-conductor return lines extending through the assemblies. A BIPV assembly having a multi-conductor return line may include a return line for the assembly itself, and one or more return lines for other assemblies.

7 Claims, 12 Drawing Sheets

(51) Int. Cl.
*H02S 40/36* (2014.01)
*H02S 40/34* (2014.01)
*H02S 20/23* (2014.01)
H02S 30/00 (2014.01)
H02S 30/10 (2014.01)
H01L 31/05 (2014.01)

(52) U.S. Cl.
CPC .......... *H02S 40/36* (2014.12); *H01L 31/0504* (2013.01); *H01L 31/0508* (2013.01); *H01L 31/0512* (2013.01); *H02S 30/00* (2013.01); *H02S 30/10* (2014.12); *Y02B 10/12* (2013.01); *Y02E 10/50* (2013.01)

(56) References Cited

U.S. PATENT DOCUMENTS

| | | | |
|---|---|---|---|
| 8,516,755 B2 * | 8/2013 | Reyal | H01L 31/02008 52/173.3 |
| 8,779,279 B2 | 7/2014 | Nakamura | |
| 9,112,080 B1 | 8/2015 | Corneille et al. | |
| 2008/0053511 A1 | 3/2008 | Nakamura | |
| 2009/0215304 A1 * | 8/2009 | Faust et al. | 439/358 |
| 2009/0242015 A1 * | 10/2009 | Wattman et al. | 136/251 |
| 2010/0154327 A1 * | 6/2010 | Reyal | H01L 31/02008 52/173.3 |
| 2012/0324808 A1 * | 12/2012 | Reyal | H01L 31/02008 52/173.3 |
| 2013/0098420 A1 | 4/2013 | Sherman et al. | |

FOREIGN PATENT DOCUMENTS

| | | |
|---|---|---|
| WO | 2009/137351 | 11/2009 |
| WO | 2009/137352 | 11/2009 |
| WO | 2009/137353 | 11/2009 |

* cited by examiner

OFFSET BUILDING INTEGRABLE PHOTOVOLTAIC STRUCTURES AND ASSEMBLIES HAVING MULTI-CONDUCTOR RETURN LINES

BACKGROUND

Photovoltaic cells are widely used for electricity generation, with one or more photovoltaic cells typically sealed within in a module that may be integrated into structures or assemblies. Multiple modules may be arranged into photovoltaic arrays used to convert solar energy into electricity by the photovoltaic effect. Arrays can be installed on building structures, such as building rooftops, and may be used to provide electricity to the buildings or to the general electrical grid.

SUMMARY

Provided are novel building integrable photovoltaic (BIPV) structures having multiple photovoltaic portions offset with respect to each other along their lengths. An offset direction can correspond to the length of a row of installed BIPV structures. In some embodiments, a BIPV structure may include three offset photovoltaic portions and three corresponding flap portions for extending under photovoltaic portions of adjacent structures and sealing interfaces between installed structures. The novel BIPV structures can facilitate installation, while providing the flexibility to avoid obstacles. Provided also are novel BIPV assemblies having multi-conductor return lines extending through the assemblies. A BIPV assembly having a multi-conductor return line may include a return line for the assembly itself, and one or more return lines for other assemblies.

In certain embodiments, an offset building integrable photovoltaic structure includes a bottom photovoltaic portion, middle photovoltaic portion, and top photovoltaic portion. The bottom photovoltaic portion includes one or more photovoltaic cells. This portion also has a top edge and bottom edge, both edges extending in a first direction. Left and right edges of this portion extend in a second direction that is substantially perpendicular to the first direction. The middle photovoltaic portion also includes one or more photovoltaic cells. Its top and bottom edges extend in the first direction, while its left and right edges extend in the second direction. The bottom and middle photovoltaic portions are arranged in such a way that the top edge of the bottom photovoltaic portion partially overlaps with and is inseparably attached to the bottom edge of the middle photovoltaic portion. Finally, the top photovoltaic portion includes one or more photovoltaic cells. It also has top and bottom edges extending in the first direction as well as left and right edges extending in the second direction. The top and middle photovoltaic portions are arranged in such a way that the top edge of the middle photovoltaic portion partially overlaps with and is attached to the bottom edge of the top photovoltaic portion. The left and right edges of the bottom photovoltaic portion are aligned with the left and right edges of the top photovoltaic portion.

In certain embodiments, the left and right edges of the bottom photovoltaic portion are offset to the right with respect to the corresponding left and right edges of the middle photovoltaic portion. In certain embodiments, the left and right edges of the bottom photovoltaic portion are offset to the left with respect to the corresponding left and right edges of the middle photovoltaic portion. The left and right edges of the bottom photovoltaic portion may be offset by at least about 25% of the length of the top edge of the bottom photovoltaic portion with respect to the left and right edges of the middle photovoltaic portion.

In certain embodiments, one or more photovoltaic cells of the bottom photovoltaic portion are interconnected in series with one or more photovoltaic cells of the middle photovoltaic portion as well as with one or more photovoltaic cells of the top photovoltaic portion. In certain embodiments, one or more photovoltaic cells of the bottom photovoltaic portion are interconnected in parallel with one or more photovoltaic cells of the middle photovoltaic portion and with one or more photovoltaic cells of the top photovoltaic portion.

The offset building integrable photovoltaic structure may include two connectors each having at least one module conductive element. Each one of these module conductive elements may be connected to photovoltaic cells of either the bottom photovoltaic portion, middle photovoltaic portion, or top photovoltaic portion. The two connectors may be provided along the top edge of the top photovoltaic portion. Each one of these connectors may include one bus conductive element. The bus conductive elements of the different connectors are interconnected with each other using a bus bar.

In certain embodiments, the offset building integrable photovoltaic structure includes a bottom flap portion having top and bottom edges extending in the first direction and left and right edges extending in the second direction. The top edge of the bottom flap portion may be inseparably attached to the bottom edge of the top photovoltaic portion. The bottom edge of the bottom flap portion may be inseparably attached to the top edge of the bottom photovoltaic portion. The left edge or right edge of the bottom flap portion may be aligned with the left edge or right edge of the bottom photovoltaic portion. In the same or other embodiments, the left edge or right edge of the bottom flap portion may be inseparably attached to the left edge or right edge of the middle photovoltaic portion.

In the same or other embodiments, an offset building integrable photovoltaic structure includes a middle flap portion having top and bottom edges extending in the first direction and left and right edges extending in the second direction. The bottom edge of the middle flap portion is inseparably attached to the top edge of the middle photovoltaic portion. The top edge of the middle flap portion extends past the top edge of the top photovoltaic portion in the second direction. The left edge or right edge of the middle flap portion is aligned with the left edge or right edge of the middle photovoltaic portion. The left edge or right edge of the middle flap portion may be inseparably attached to the left edge or right edge of the top photovoltaic portion. A width of the middle flap portion, which is defined by its top and bottom edges, may be at least about 1 inch wider than a width of the top photovoltaic portion, which is defined by its top and bottom edges.

In certain embodiments, an offset building integrable photovoltaic structure includes a top flap portion having top and bottom edges extending in the first direction and left and right edges extending in the second direction. The bottom edge of the top flap portion is inseparably attached to the top edge of the top photovoltaic portion. The left edge of the top flap portion is aligned with the left edge of the top photovoltaic portion. The right edge of the top flap portion is aligned with the right edge of the top photovoltaic portion. A width of the top flap portion, which is defined by its top and bottom edges, may be a wider than a width of the top photovoltaic portion, middle photovoltaic portion, and/or bottom photovoltaic portion. The widths of these portions are defined by their corresponding top and bottom edges. The top flap portion, middle flap portion, and/or bottom flap portion may be field configurable such that one or more cutouts may be made in the top flap portion, middle flap portion, and bottom flap portion in the field. The top photovoltaic portion, middle photovoltaic portion, and bottom photovoltaic portion may have substantially the same dimensions.

Also provided is a building integrable photovoltaic assembly including a photovoltaic module, multi-conductor return line, first module connector, and second module connector. The photovoltaic module includes a front side and back side. It also includes one or more photovoltaic cells disposed along the front side and having two contact points. The front side and back side form first and second edges that define the length of the photovoltaic module. The multi-conductor return line includes two bus bars extending between the first edge and second edge. The two bus bars are electrically insulated from the two contact points of the photovoltaic module. The first module connector is provided along the first edge and includes three conductive elements, one of which is electrically connected to one of the two contact points of the photovoltaic cells. The other two conductive elements of the first module connector are independently connected to the two bus bars, i.e., one conductive element to one bus bar and another conductive element to a different bus bar. The second module connector is provided along the second edge and includes three conductive elements, one of which is electrically connected to another one of the two contact points of the photovoltaic cells, while the other two conductive elements are independently connected to the two bus bars.

In certain embodiments, the multi-conductor return line also includes a third bus bar extending between the first and second edges. The third bus bar interconnects fourth conductive elements of the first and second module connectors. These fourth conductive elements are not connected to the photovoltaic cells. The multi-conductor return line may be removably attached to the photovoltaic module.

One of the two bus bars of the photovoltaic module may have a cross-sectional area at least about twice greater than the other bus bar, for example, at least about twice greater. In other embodiments, the two bus bars have substantially the same cross-sectional areas. The two bus bars may be insulated by a shared insulation sheath. The photovoltaic module may include a photovoltaic portion and moisture flap portion. The multi-conductor return line may be positioned in the moisture flap portion of the module.

Provided also is a row of interconnected building integrable photovoltaic assemblies including a first building integrable photovoltaic assembly and second building integrable photovoltaic assembly. The first assembly includes a first photovoltaic module having one or more photovoltaic cells. These cells may include first and second contact points. The first module may also include a first edge and a first bus bar extending along the module to this edge. The first bus bar is electrically connected to the first contact point. The second assembly includes a second photovoltaic module having one or more photovoltaic cells. These cells may include third and fourth contact points (i.e., two contact points that are different from the first and second contact points of the first module of the first assembly). The second photovoltaic module also includes a second edge. The second edge of this module is adjacent to the first edge of the first module. The second module may also include a second bus bars extending along this module to the second edge.

The second bus bar is electrically connected to the third contact point. The second module may include a third bus bar extending along the second photovoltaic module to the second edge. The third bus bar may be electrically connected to the second contact point of the first photovoltaic module. Finally, the second module may include a fourth bus bar extending along the second photovoltaic module to the second edge. The fourth bus bar is electrically connected to the first bus bar of the first photovoltaic module. Connections between the third bus bar and the second contact point of the first photovoltaic module may be provided by a first module connector attached to the first photovoltaic module along the first edge and by a second module connector attached to the second photovoltaic module along the second edge.

These and other embodiments are described further below with reference to the figures.

DETAILED DESCRIPTION OF EXAMPLE EMBODIMENTS

While photovoltaic modules provide a great source of alternative energy, they tend to be expensive, which greatly limits adoption of this technology. A major cost component is installation. It has been estimated that as much as 90% of the overall cost of installed photovoltaic arrays is associated with their installation, while the remaining 10% is associated with materials including photovoltaic modules. Installation costs are driven by various different operations such as handling individual modules, securing modules on building structures, sealing building structures around modules, and forming electrical connections. These operations are performed for each individual module and can be quite labor intensive. Often, different operations involve different installation professionals, such as roofers and electricians.

Provided are novel building integrable photovoltaic (BIPV) structures having offset orientations. In some embodiments, the offset BIPV structures include multiple photovoltaic portions offset with respect to each other along their lengths. The direction of offset can correspond to the length of a row of installed BIPV structures. Each photovoltaic portion may provide a separate interface for integration with other building components. A BIPV structure may include three offset photovoltaic portions and three corresponding flap portions for extending under photovoltaic portions of adjacent structures and sealing interfaces between installed structures. In general, the number of photovoltaic and flap portions of a BIPV structure can be determined based on the sizes of individual portions and various installation requirements, such as an overall weight and installation flexibility. Multiple offset BIPV structures may differ based on the offset directions of their photovoltaic portions.

Figure 1A:
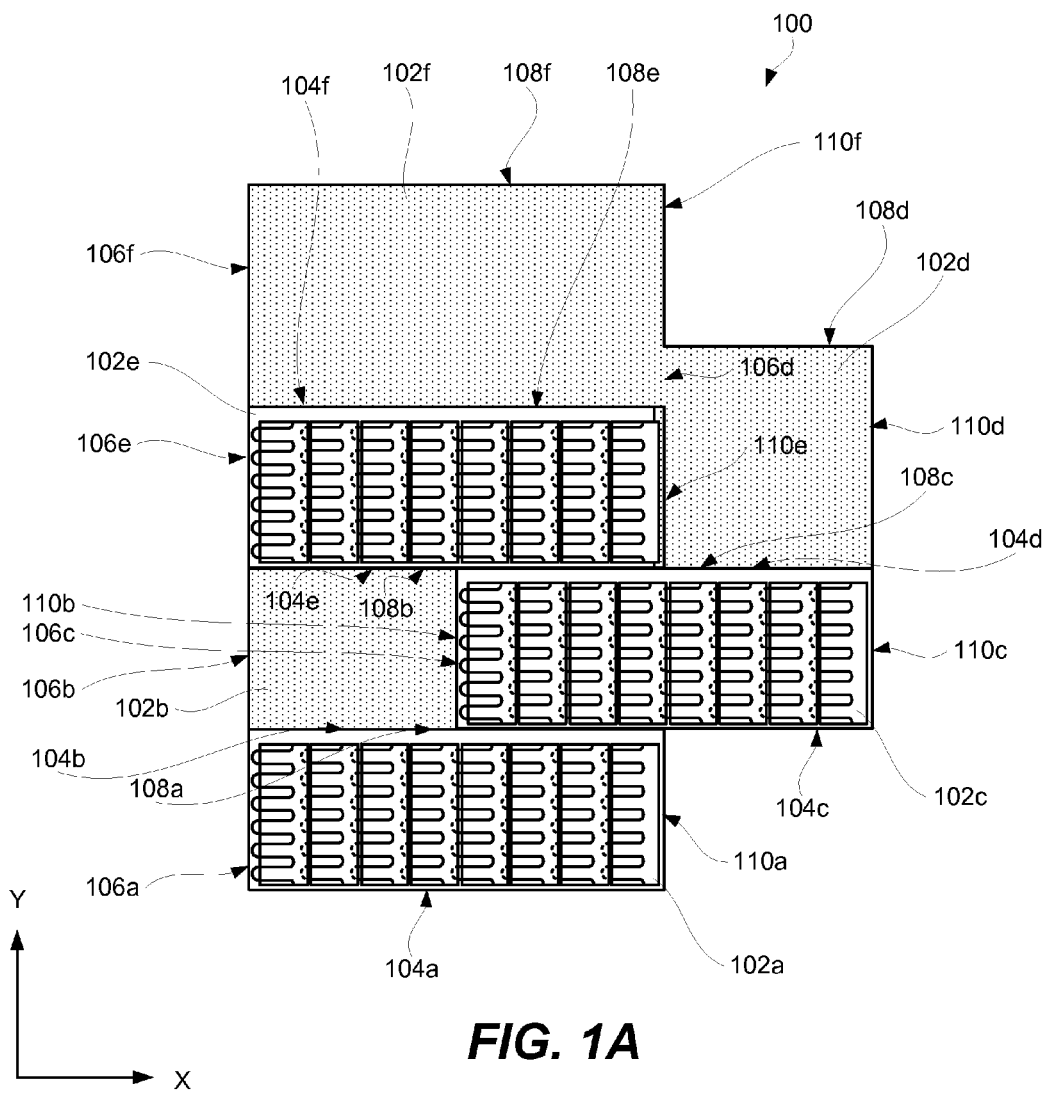
FIG. 1A illustrates an offset BIPV structure having three photovoltaic portions and three corresponding flap portions, with the middle photovoltaic portion offset in one direction with respect to the other two photovoltaic portions in accordance with certain embodiments.

FIG. 1A illustrates an offset BIPV structure 100 having three photovoltaic portions 102a, 102c, and 102e and three flap portions 102b, 102d, and 102f, in accordance with certain embodiments. In general, BIPV structures may have any number of photovoltaic portions and corresponding flap portions. For example, a BIPV structure having only two photovoltaic portions and two flap portions would not include bottom photovoltaic portion 102a and bottom flap portion 102b but would include all other portions shown in FIG. 1A. A BIPV structure having four photovoltaic portions and four flap portions would include another set of photovoltaic and flap portions attached at the bottom of the structure that are similar to bottom photovoltaic portion 102a and bottom flap portion 102b shown in FIG. 1A. The offset BIPV structure 100 shown in FIG. 1A is scalable. A larger number of photovoltaic and flap portions may help to reduce installation costs. However, large offset structures may become too heavy for handling and reduce installation flexibility, particularly around openings. This is further explained below.

Each one of photovoltaic portions 102a, 102c, and 102e includes one or more photovoltaic cells. The photovoltaic cells may be interconnected in parallel, in series, or in various combinations of these interconnection schemes in these portions. Examples of photovoltaic cells include copper indium gallium selenide (CIGS) cells, cadmium-telluride (Cd—Te) cells, amorphous silicon (a-Si) cells, microcrystalline silicon cells, crystalline silicon (c-Si) cells, gallium arsenide multi junction cells, light adsorbing dye cells, organic polymer cells, and other types of photovoltaic cells.

A photovoltaic cell has a photovoltaic layer that generates a voltage when exposed to sunlight. In certain embodiments, the photovoltaic layer includes a semiconductor junction. The photovoltaic layer may be positioned adjacent to a back conductive layer, which, in certain embodiments, is a thin layer of molybdenum, niobium, copper, and/or silver. The photovoltaic cell may also include a conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also in the scope. The photovoltaic cell may also include a top conductive layer. This layer typically includes one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers to 1,000 nanometers (for example, between about 200 nanometers and 800 nanometers), with other thicknesses within the scope.

In certain embodiments, photovoltaic cells are interconnected using one or more current collectors (shown as serpentine-shaped wires in FIG. 1A). A current collector may be attached to and configured to collect electrical current from the top conductive layer. A current collector may also provide electrical connections to adjacent cells. A current collector includes a conductive component (e.g., an electrical trace or wire) that contacts the top conductive layer (e.g., a TCO layer). A current collector may further include a top carrier film and/or a bottom carrier film, which may be made from transparent insulating materials to prevent electrical shorts with other elements of the cell and/or module. In certain embodiments, a bus bar is attached directly to the substrate of a photovoltaic cell. A bus bar may also be attached directly to the conductive component of the current collector. For example, a set of photovoltaic cells may be electrically interconnected in series with multiple current collectors (or other interconnecting wires). One bus bar may be connected to a substrate of a cell at one end of this set, while another bus bar may be connected to a current collector at another end. While the above discussion gives examples of various components of photovoltaic portions of the BIPV structures described herein, the photovoltaic portions of the BIPV structures described herein are not so limited and may include any photovoltaic portion having one or more photovoltaic cells.

Returning to FIG. 1A, the orientation of different photovoltaic and flap portions in BIPV structure 100 may be described with reference to edges of these portions. Specifically, bottom photovoltaic portion 102a includes a top edge 108a and a bottom edge 104a extending in the X direction as well as a left edge 106a and a right edge 110a extending in the Y direction. The Y direction may be substantially perpendicular to the X direction. In the roofing application, the X direction may be parallel to the roof ridge, while the Y direction may be parallel to the gable ends. Likewise, middle photovoltaic portion 102c includes a top edge 108c and a bottom edge 104c extending in the X direction as well as a left edge 106c and a right edge 110c extending in the Y direction. Bottom photovoltaic portion 102e includes a top edge 108e and a bottom edge 104e extending in the X direction as well as a left edge 106e and a right edge 110e extending in the Y direction.

Top edge 108a of bottom photovoltaic portion 102a partially overlaps with and is inseparably attached to bottom edge 104c of middle photovoltaic portion 102c. Inseparable attachment may involve integration of the two portions along their respective edges during manufacturing of the BIPV structure. For example, the two portions may be formed during the same molding operation and may be parts of a continuous or monolithic body. In other embodiments, the two portions may be welded or otherwise attached together during fabrication, such that these portions remain attached during installation and operation of the BIPV structure. Inseparably attached portions are maintained together and generally must be deliberately tampered with to be separated, such as cutting. Inseparable attachments do not allow for water or another other matter to go through the interface between the inseparably attached components. In certain embodiments, two or more inseparably attached portions may have a shared back sheet. For example, all flap and photovoltaic portions may have a continuous shared base such that there are no seams in between inseparably attached portions. Each photovoltaic portion then also has one or more photovoltaic cells supported on the front side of such base. In other embodiments, each portion or a group of portions may be fabricated as a subassembly and then multiple subassemblies formed into a final BIPV structure such that portions cannot be later separated.

In a similar manner, top edge 108c of middle photovoltaic portion 102c partially overlaps with and is inseparably attached to bottom edge 104e of top photovoltaic portion 102e. Furthermore, left edge 106a of bottom photovoltaic portion 102a is aligned with left edge 106e of top photovoltaic portion 102e. Right edges 110a and 110e of these two portions are also aligned. As such, bottom photovoltaic portion 102a and top photovoltaic portion 102e are aligned with respect to each other in the X direction.

At the same time, middle photovoltaic portion 102c is offset with respect to bottom photovoltaic portion 102a and top photovoltaic portion 102e in the X direction when viewing from the top as in FIG. 1A. A middle photovoltaic portion may be offset to the right with respect to the other two photovoltaic portions as shown in the top view in FIG. 1A. This configuration may be referred to as a right-hand configuration. Alternatively, the middle photovoltaic portion may be offset to the left with respect to the other two photovoltaic portions as shown in and further described below with reference to FIG. 1B. This configuration may be referred to as a left-hand configuration. The offset may be at least about 10% of the length of these photovoltaic portions or, more specifically, at least about 25%. Examples of offsets include about ⅓ of the length or ½ of the length. This offset provides moisture sealing features when the structure is installed and interfaces with other BIPV structures, modules, and/or building components. Furthermore, the offset can provide aesthetic appeal to the array.

FIG. 1A also illustrates BIPV structure 100 having bottom flap portion 102b, middle flap portion 102d, and top flap portion 102f. The orientation of these portions can also be described with reference to their edges. Specifically, bottom flap portion 102b includes top edge 108b and bottom edge 104b extending in the X direction as well as left edge 106b and right edge 110b extending in the Y direction. Likewise, middle flap portion 102d includes top edge 108d and bottom edge 104d extending in the X direction as well as left edge 106d and a right edge 110d extending in the Y direction. Finally, top flap portion 102f includes top edge 108f and bottom edge 104f extending in the X direction as well as left edge 106f and right edge 110f extending in the Y direction.

In this example, top edge 108b of bottom flap portion 102b is inseparably attached to bottom edge 104e of top photovoltaic portion 102e, while bottom edge 104b of bottom flap portion 102b is inseparably attached to top edge 108a of bottom photovoltaic portion 102a. Left edge 106b of bottom flap portion 102b is aligned with left edge 106a of bottom photovoltaic portion 102a as well as with left edge 106e of top photovoltaic portion 102e. Right edge 110b of bottom flap portion 102b is inseparably attached to left edge 106c of middle photovoltaic portion 102c. Furthermore, bottom edge 104d of middle flap portion 102d is inseparably attached to top edge 108c of middle photovoltaic portion 102a, while top edge 108d of middle flap portion 102d extends past top edge 108e of top photovoltaic portion 102e in the Y direction. As such, the width of middle flap portion 102d, which is defined by its top and bottom edges 104d and 108d, is wider that the width of top photovoltaic portion 102e, which is defined by its own top and bottom edges 104e and 108e. For example, this width difference may be at least about one inch or even at least about two inches. This width difference provides an overlap between flap portions of different BIPV structures for sealing purposes.

Continuing with this example, left edge 106d of middle flap portion 102d is inseparably attached to right edge 110e of top photovoltaic portion 102e, while right edge 110d of middle flap portion 102d is aligned with right edge 110c of middle photovoltaic portion 102c in the X direction. Bottom edge 104f of top flap portion 102f is inseparably attached to top edge 108e of top photovoltaic portion 102e. At the same time, left edge 106f of top flap portion 102f is aligned with left edge 106e of top photovoltaic portion 102e, while right edges 110f and 110e of these portions are also aligned. As such, top flap portion 102f and top photovoltaic portion 102e are aligned with respect to each other in the X direction.

Integration of three photovoltaic portions 102a, 102c, and 102e and three flap portions 102b, 102d, and 102f may be performed during fabrication of the BIPV structures. For example, photovoltaic cells may be arranged into intermediate subassemblies, such as photovoltaic inserts that are later attached to other components to form photovoltaic portions 102a, 102c, and 102e. A photovoltaic insert may include back and front sealing sheets and one or more photovoltaic cells sealed in between these sheets. The insert may also include two or more electrical leads for connecting to other inserts of this structure. The back sealing sheet may be then attached to a base of the overall BIPV structure to form a photovoltaic portion. As explained above, the base may be shared among multiple, for example, all portions of the BIPV structure. FIG. 1C shows an example of a shared base 130 including flap portions 102b, 102d, and 102f, prior to attachment of photovoltaic inserts into corresponding photovoltaic portions identified with dashed blocks. In certain embodiments, a photovoltaic insert is over-molded during the molding of flap portions 102b, 102d, and 102f as well as any other molded parts of the corresponding photovoltaic portion. As such, there are no gaps between the inseparably attached edges of these portions. In some embodiments, there is a permanent seal at interface of each photovoltaic portion and a corresponding flap portion that prevents water getting under the BIPV structure when it is positioned on a building structure.

Figure 1B:
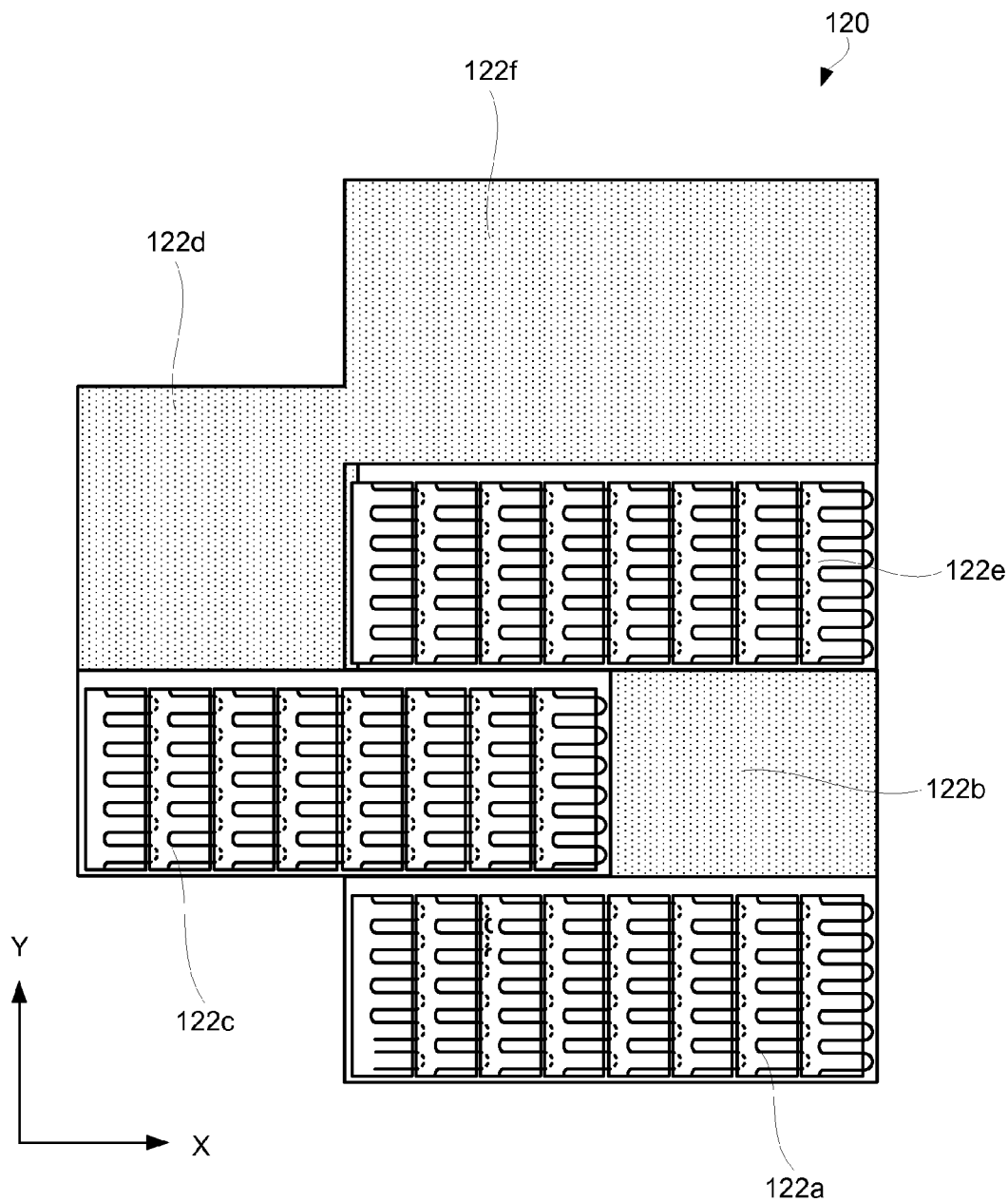
FIG. 1B illustrates another offset BIPV structure having three photovoltaic portions and three corresponding flap portions, with the middle photovoltaic portion offset in a different direction than that shown in the FIG. 1B with respect to the other two photovoltaic portion, in accordance with certain embodiments.
Figure 1C:
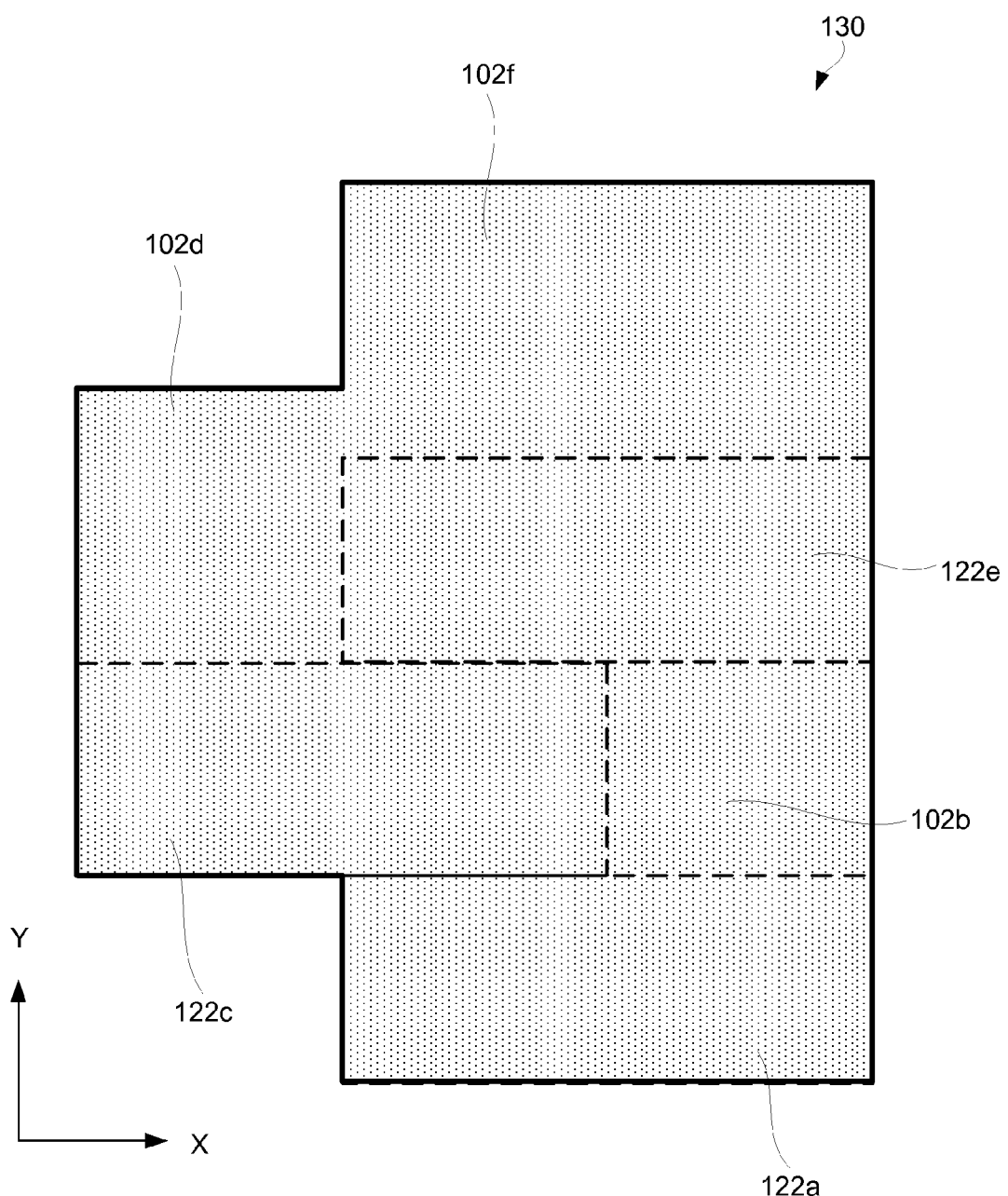
FIG. 1C is a schematic illustration of a shared base including three flap portions and supports for corresponding photovoltaic inserts prior to attachment of these inserts, in accordance with certain embodiments.

FIG. 1B illustrates another offset BIPV structure 120 having three photovoltaic portions 122a, 122c, and 122e and three flap portions 122b, 122d, and 122f, in accordance with certain embodiments. In this example, middle photovoltaic portion 122c is shifted to the left with respect to top photovoltaic portion 122e and bottom photovoltaic portion 122a along the X direction when viewing from the top as in FIG. 1B. This configuration may be referred to as a left-hand configuration or a left-hand BIPV structure. Because middle photovoltaic portion 122c is shifted to the left, bottom flap portion 122b is positioned to the right of middle photovoltaic portion 122c. The right edge of bottom flap portion 122b is aligned with right edges of top photovoltaic portion 122e and bottom photovoltaic portion 122a. Other edges of bottom flap portion 122b are inseparably attached to three photovoltaic portions as shown in FIG. 1B. Furthermore, middle flap portion 122d is positioned to the left of top photovoltaic portion 122e and is inseparably attached to the left edge of this photovoltaic portion as well as to the top edge of middle photovoltaic portion 122c.

Figure 2A:
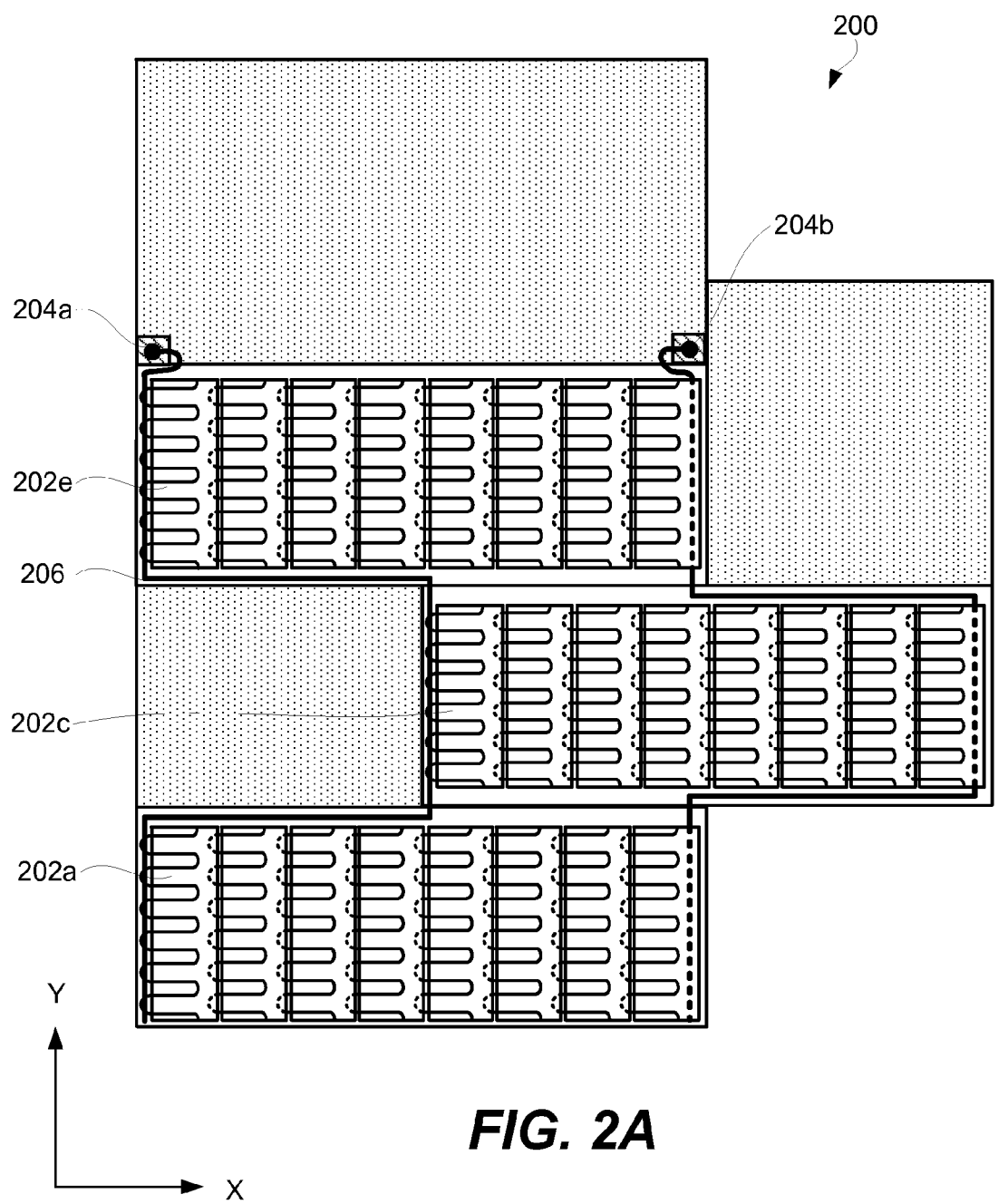
FIG. 2A illustrates an offset BIPV structure having photovoltaic cells in the three photovoltaic portions interconnected in parallel, in accordance with certain embodiments.
Figure 2B:
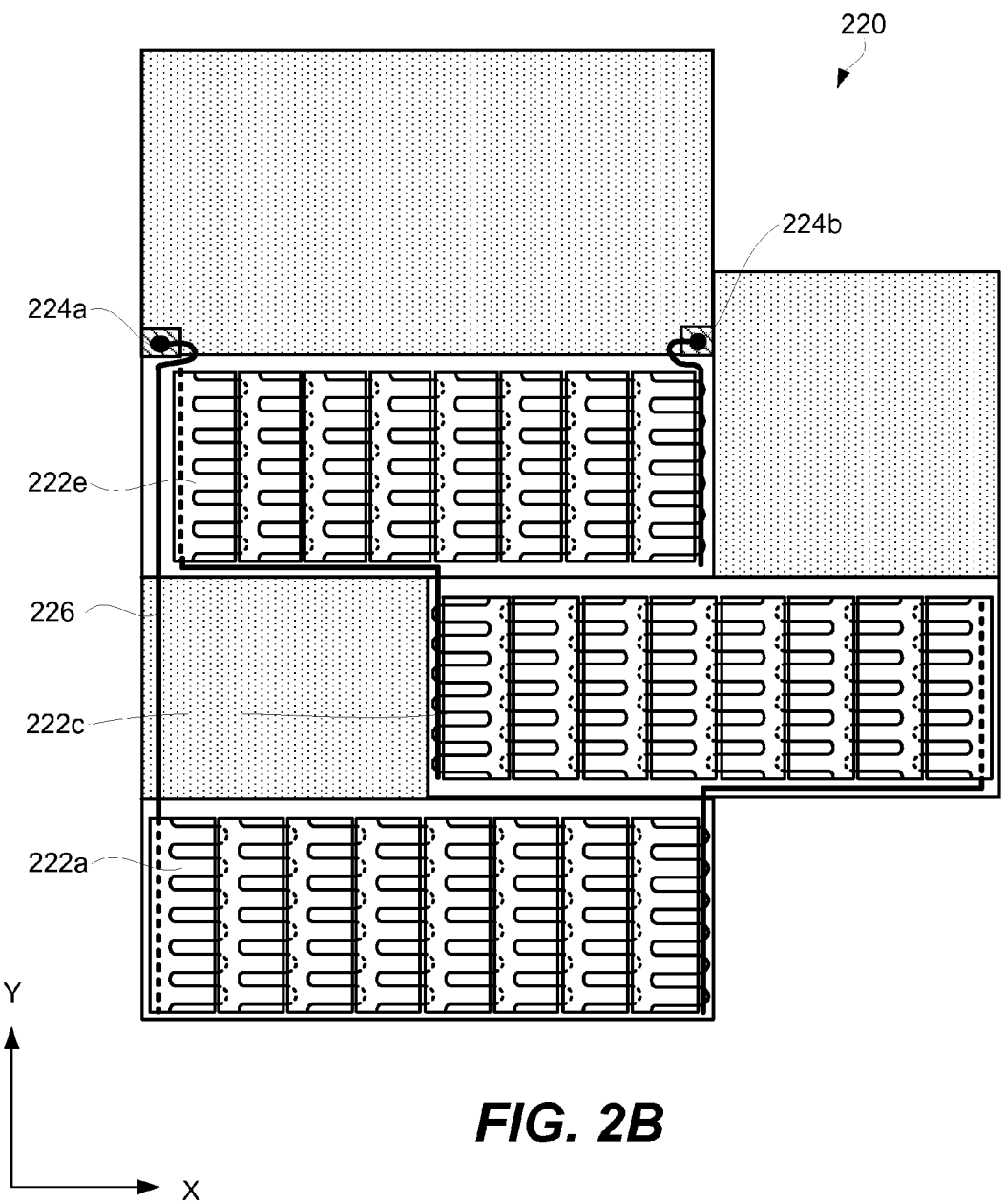
FIG. 2B illustrates another offset BIPV structure having photovoltaic cells in the three photovoltaic portions interconnected in series, in accordance with certain embodiments.

As stated above, each photovoltaic portion in offset BIPV structures contains a set of photovoltaic cells for generating electrical power. Multiple photovoltaic sets in each offset BIPV structure may be electrically interconnected during fabrication of the structure to eliminate a need for making these connections in the field. The sets may be connected in parallel as shown in FIG. 2A, in series as shown in FIG. 2B, or according to some other connection schemes. An offset BIPV may include two connectors having conductive elements that are connected each of these sets.

Specifically, FIG. 2A illustrates an offset BIPV structure 200 having three sets of photovoltaic cells arranged in three photovoltaic portions 202a, 202c, and 202e, such that these sets are interconnected in parallel, in accordance with certain embodiments. Each set includes multiple interconnected photovoltaic cells and has two contact points having different polarities. As shown in FIG. 2A, one contact point may be attached to a front side of one photovoltaic cell and may be referred to as a front polarity point. Another contact point may be attached to a back side of another photovoltaic cell and may be referred to as a back polarity point. In FIG. 2A, all three photovoltaic portions 202a, 202c, and 202e have their front polarity points positioned on the left with their back polarity points positioned on the right.

BIPV structure 200 has two connectors 204a and 204b each including one contact conductive element. The conductive element of connector 204a is shown connected to the front polarity points of photovoltaic portions 202a, 202c, and 202e. These connections may be provided by various electrical leads 206 that may extend through the photovoltaic portions and/or through the flap portion. The conductive element of connector 204b is shown connected to the back polarity points of photovoltaic portions 202a, 202c, and 202e using a similar type of connection (shown in dotted lines).

FIG. 2B illustrates another offset BIPV structure 220 having three sets of photovoltaic cells arranged in three photovoltaic portions 222a, 222c, and 222e interconnected in series, in accordance with certain embodiments. The conductive element of connector 224a is shown connected to the back polarity point of bottom photovoltaic portion 222a. The front polarity point of that portion is connected to the back polarity point of middle photovoltaic portion 222c, while the front polarity point of middle photovoltaic portion 222c is connected to the back polarity point of top photovoltaic portion 222e. Finally, the front polarity point of top photovoltaic portion 222e is connected to the conductive element of connector 224b. The connections between these photovoltaic portions may be provided by electrical leads 226 similar to the ones described in the previous example. FIG. 2B illustrates middle photovoltaic portion 222c having its polarity points flipped in the X direction relative to bottom photovoltaic portion 222c and top photovoltaic portion 222e. This orientation of photovoltaic portions may help to simplify or, more specifically, to shorten routing of electrical leads 226. In other embodiments, polarity points of all photovoltaic portions have the same orientation with respect to the X direction.

Multiple offset BIPV structures provided in the same array can be interconnected to form a photovoltaic string. A photovoltaic array may have one or more strings, and each string may have multiple BIPV structures. A number of BIPV structures in a string and interconnection schemes within the string are determined by building codes and electrical requirements, array designs, and other factors. For example, connections between BIPV structures that have a relatively low voltage (e.g., less than about 60 V) may be performed by roof installers, while connections having higher voltage ratings may require licensed electricians. From the installation cost perspective, it may be desirable to interconnect offset BIPV structures without involving licensed electricians. In certain embodiments, the interconnection schemes between offset BIPV structures are such that connectors of these structures have voltage ratings of less than about 60 V.

Figure 3A:
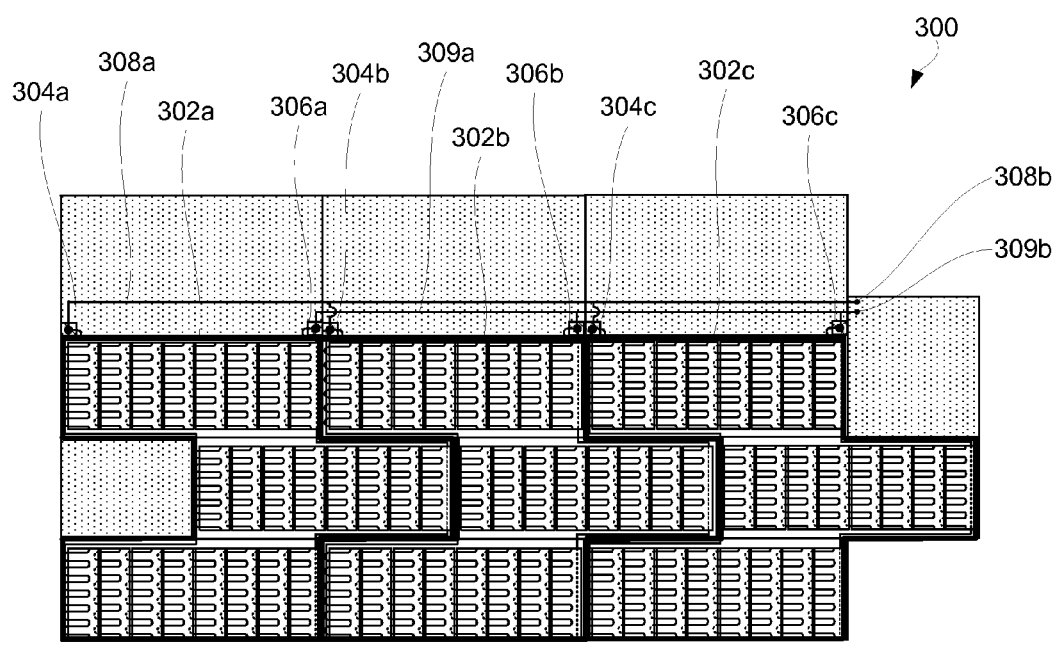
FIG. 3A is a schematic illustration of three offset BIPV structures interconnected in parallel and forming a photovoltaic string, in accordance with certain embodiments.

FIG. 3A is a schematic illustration of three offset BIPV structures 302a, 302b, and 302c interconnected in parallel, in accordance with certain embodiments. In order to more clearly distinguish different BIPV structures, boundaries of their photovoltaic portions are shown with thicker lines. All three BIPV structures 302a, 302b, and 302c have right-handed configurations, with their middle photovoltaic portions shifted to the right.

Parallel connections between BIPV structures 302a, 302b, and 302c are provided by lines 308a and 309a. These lines have contact points 308a and 309a for making an external connection to this string of BIPV structures. These lines may be integrated into the structures and may be formed, for example, by a series of interconnected bus bars. Alternatively, lines 308a and 309a may be one or two separate components and added to that array during its installation. Left connectors 304a, 304b, and 304c of these BIPV structures are interconnected using line 308a. At the same time, right connectors 306a, 306b, and 306c of these BIPV structures are interconnected using line 309a. According to this connection scheme, the voltage between leads 308b and 309b is the same between any connector pair of any BIPV structure in this string. A lower voltage provided by this connection scheme may allow electrical connections to be made by a roof installer without involving a licensed electrician.

Figure 3B:
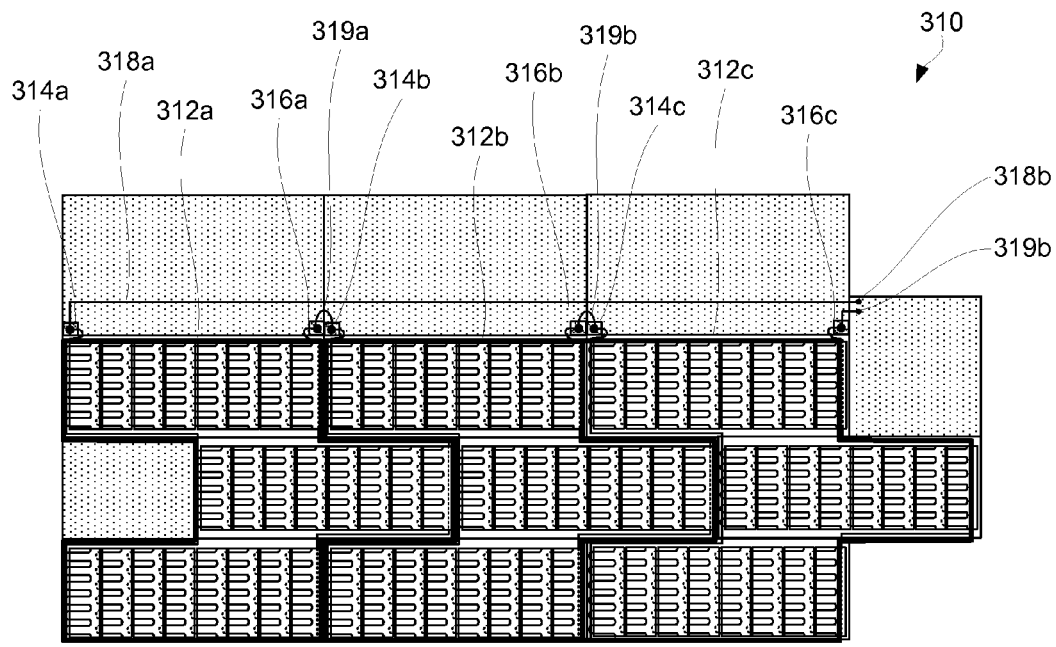
FIG. 3B is a schematic illustration of three offset BIPV structures interconnected in series and forming a different photovoltaic string than that shown in FIG. 3A, in accordance with certain embodiments.

FIG. 3B is a schematic illustration of three offset BIPV structures 312a, 312b, and 312c interconnected in series, in accordance with certain embodiments. Specifically, left connector 314a of BIPV structure 312a is connected to a return line 318a, which may be integrated into the structures or be a standalone component. Return line 318a is not connected to any other connector and has a contact point 318b for making an external connection to the string. Right connector 316a of BIPV structure 312a is connected to left connector 314b of BIPV structure 312b using, for example, jumper 319a. These two connectors should have different polarities. Likewise, right connector 316b of BIPV structure 312b is connected to left connector 314c of BIPV structure 312c using, for example, another jumper 319b. Right connector 316c of BIPV structure 312c is connected to another contact point 319b of the string. Therefore, contact points 318b and 319b provided two external connections to this string.

As stated above, flap portions of the offset BIPV structures can be designed to extend under photovoltaic and flap portions of similar adjacent structures in order to seal interfaces between these structures as further described below with reference to FIG. 4. Furthermore, flap portions may be used for sealing interfaces with other building components, such as asphalt shingles. Flaps of these building components and other structures extending and overlapping with interfaces may be also used for sealing these interfaces.

Figure 4:
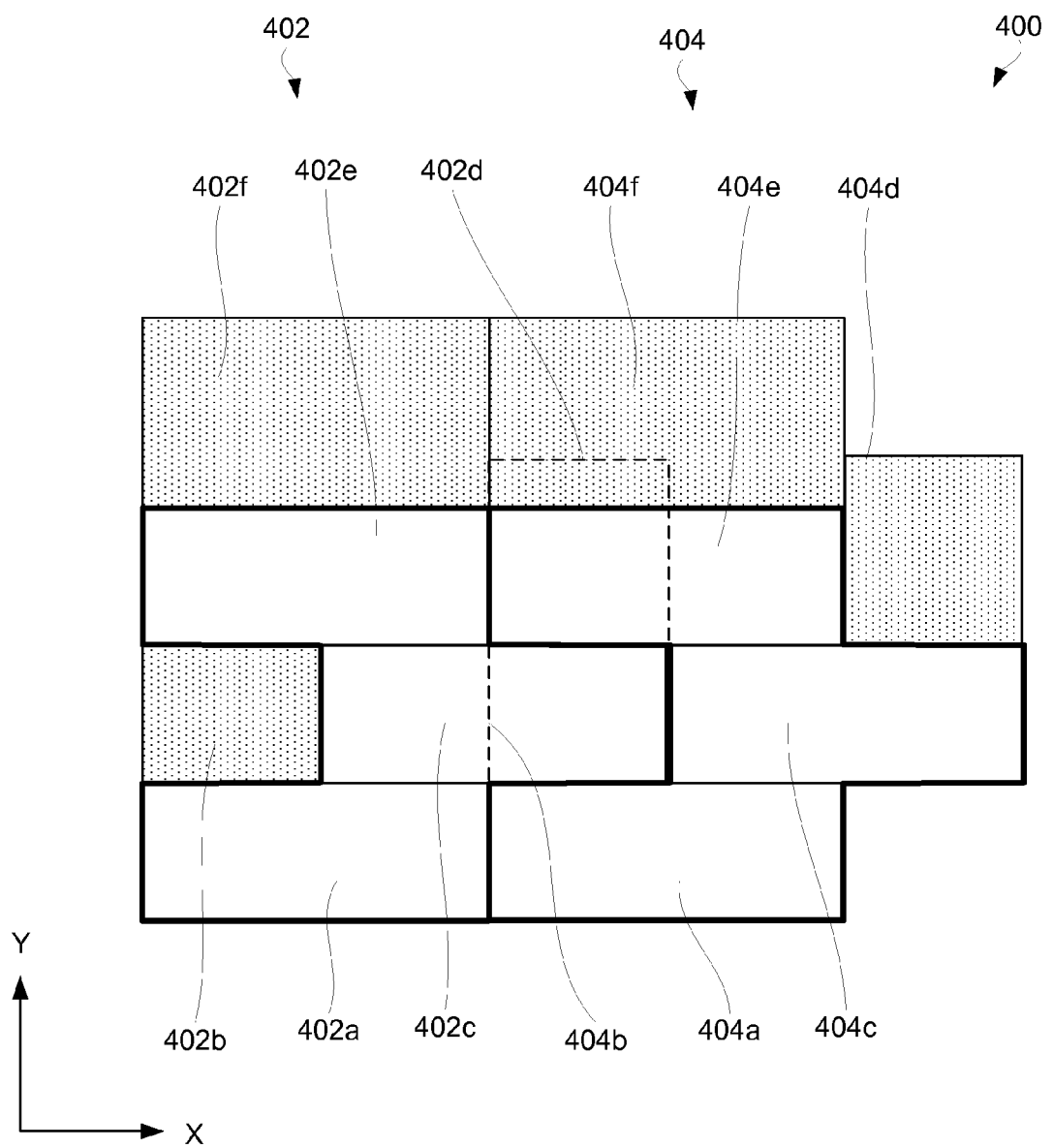
FIG. 4 is a schematic illustration of two adjacent BIPV structures positioned in the same row showing various overlaps of their photovoltaic and flap portions to seal interfaces between these structures, in accordance with certain embodiments.

Specifically, FIG. 4 is a schematic illustration of an assembly 400 including two adjacent BIPV structures 402 and 404 positioned in the same row, in accordance with certain embodiments. BIPV structure 402 includes three photovoltaic portions, i.e., bottom photovoltaic portion 402a, middle photovoltaic portion, 402c, and top photovoltaic portion 402e, which are illustrated for clarity as white (unfilled) rectangles. In addition to these photovoltaic portions, BIPV structure 402 also includes three flap portions, i.e., bottom flap portion 402b, middle flap portion 402d, and top flap portion 402f. Likewise, BIPV structure 402 includes three photovoltaic portions, i.e., bottom photovoltaic portion 404a, middle photovoltaic portion 404c, and top photovoltaic portion 404e, and three flap portions, i.e., bottom flap portion 404b, middle flap portion 404d, and top flap portion 404f. Middle flap portion 402d of structure 402 is covered by top photovoltaic portion 404e and by top flap portion 404f of BIPV structure 404. Boundaries of middle flap portion 402d with respect to top photovoltaic portion 404e and top flap portion 404f are shown with dashed lines to reflect these overlaps. Furthermore, bottom flap portion 404b of BIPV structure 404 is covered by middle photovoltaic portion 402c of BIPV structure 402, with boundaries of bottom flap portion 404b also shown with a dashed line.

Sealing of each interface line and corner will now be explained in more detail. The interface between two top photovoltaic portions 402e and 404e is sealed by middle flap portion 402d, which is inseparably attached to top photovoltaic portions 402e and top flap portion 402f such that there is no gap under this interface. The interface between top photovoltaic portion 404e and middle photovoltaic portion 402c is sealed by middle flap portion 402d, which is inseparably attached to middle photovoltaic portion 402c. The corner between these two interfaces is also sealed by middle flap portion 402d due to its attachment to top photovoltaic portion 402e and middle photovoltaic portion 402c.

Bottom flap portion 404b is inseparably attached to all three photovoltaic portions of structure 404, i.e., top photovoltaic portion 404e, middle photovoltaic portion 404c, and bottom photovoltaic portion 404a. This attachment seals the interface between middle photovoltaic portions 404c and 402c and both corners at the ends of this interface. Furthermore, this attachment helps to seal an interface between top photovoltaic portion 404e and middle photovoltaic portion 402c and another interface between middle photovoltaic portion 402c and bottom photovoltaic portion 404a. This sealing is in addition to other sealing features of assembly 400 thereby establishing sealing overlaps.

An interface between bottom photovoltaic portions 402a and 404a and respective corners is not sealed by any flap portions of these structures. Instead, it may be sealed by top flap portions of other structures positioned in a lower row (not shown) or some other sealing features. These flaps or sealing features will generally extend below between bottom photovoltaic portions 402a and 404a and overlap with the interface between these portions. Furthermore, these flaps or sealing features may extend above the interface between bottom photovoltaic portion 404a and middle photovoltaic portion 402c to seal this interface and establishing sealing overlaps.

Figure 5A:
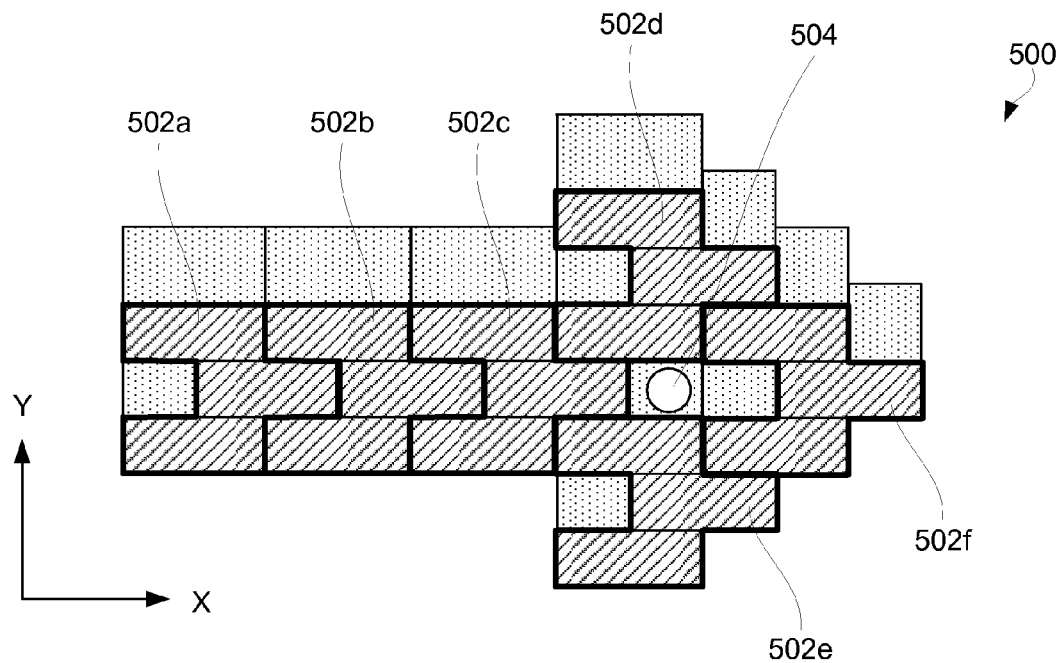
FIGS. 5A-5D illustrate four different examples of offset BIPV structures arranged around obstacles on building structures such that photovoltaic portions of these structures do not interference with the obstacles.
Figure 5B:
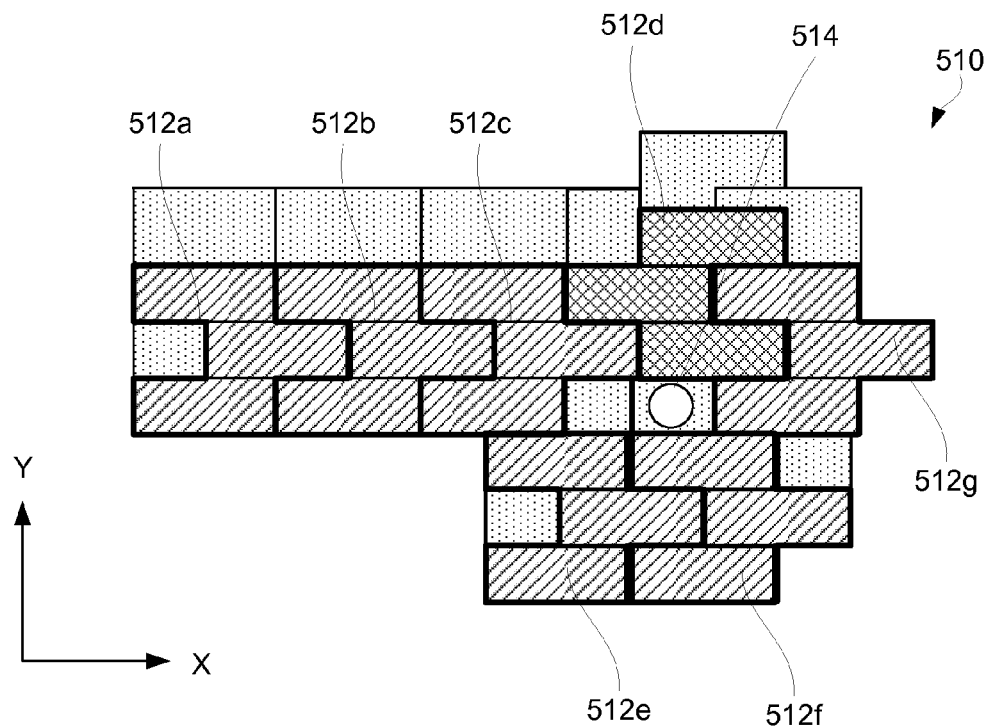
Figure 5C:
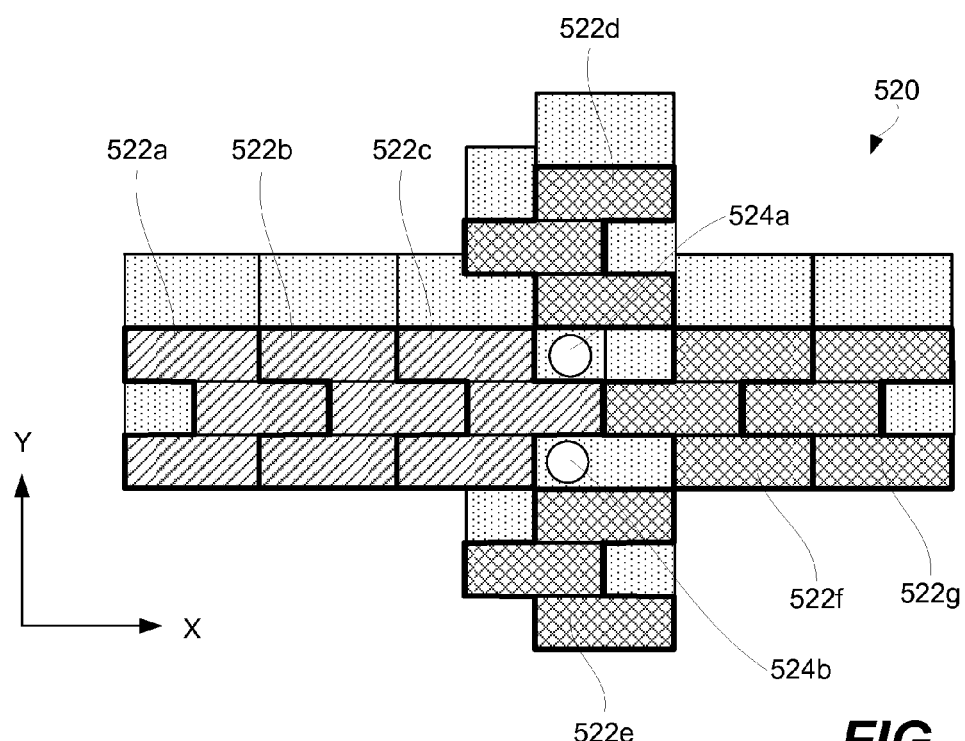

Offset BIPV structures provide additional installation options when obstacles are present on building structures used for installation of photovoltaic arrays. Forming electrical connections and mechanical integrations around such obstacles may be challenging when conventional BIPV modules are used. The larger footprints of BIPV structures, the offset design and installation options can help to overcome some of these challenges and provide additional features. FIGS. 5A-5C illustrate four different examples of offset BIPV structures arranged around obstacles such that photovoltaic portions these structures do not interference with the obstacles.

Specifically, FIG. 5A is a schematic illustration of a photovoltaic string 500 including six offset BIPV structures 502a-502f that are arranged around obstacle 504, in accordance with certain embodiments. In this example, only structures having right-handed configurations are used for this string. Four structures 502a, 502b, 502c, and 502f are all aligned with respect to each other in the Y direction and form a row. However, another such structure cannot be positioned in between and aligned with respect to structures 502c and 502f because obstacle 504 is present in this area and would interfere with a middle photovoltaic portion of an additional structure. Unlike flap portions, photovoltaic portions are not easily cut or otherwise modified.

To form a continuous array around obstacle 504, two other structures 502d and 502e are used, both of which are shifted in the Y direction with respect to the other structures forming the row. Structure 502d is shifted upward such that the bottom photovoltaic portion of structure 502d is aligned with the top photovoltaic portions of structures 502c and 502f. At the same time, structure 502e is shifted downward such that the top photovoltaic portion of structure 502d is aligned with the bottom photovoltaic portions of structures 502c and 502f. In this arrangement, obstacle 504 does not interfere with any photovoltaic portions. Instead, obstacle 504 overlaps with the top flap portion of structure 502e, which provides sealing to the building structure around obstacle 504. Unlike photovoltaic portions, flap portions may be easily cut in the field to form openings to fit around obstacles. Additional sealing feature may be needed to seal some interfaces in string 500 because of the shifted positions of structures 502d and 502e. Specifically, an interface between the bottom photovoltaic portion of structure 502d and top photovoltaic portion of structure 502f may need to be separately sealed.

Structures 502d and 502e may be electrically connected to other modules in this string. Alternatively, one of these structures may be interconnected with structures in an adjacent row and therefore be a part of a different electrical string. In certain embodiments, different types of BIPV structures, as further explained below with reference to FIG. 5B, and/or various combinations of BIPV structures and modules may be arranged into the same photovoltaic array, for example, to fill spaces around obstacles.

A brief description of BIPV modules may help to understand various mechanical arrangement and electrical connection schemes that can be used between BIPV structures and BIPV modules. A BIPV module includes only one photovoltaic portion and one flap portion. The photovoltaic portion in turn includes one or more photovoltaic cells similar to photovoltaic portions of the BIPV structures described above. A photovoltaic portion is an area of BIPV module that does not extend under other BIPV modules or similar building materials (e.g., roofing shingles) after installation. After installation, the flap portion extends under other BIPV modules or structures, while the photovoltaic portion may extend under flap portions of other BIPV modules or structures. The flap and photovoltaic portions of a BIPV module can be aligned in a manner similar to the top flap portion and top photovoltaic portion of the BIPV structure illustrated in FIG. 1A.

In the example shown in FIG. 5A, two BIPV modules may be used to fill the space above and below obstacle 504 instead of BIPV structure 502e and 502d. A BIPV module has only one photovoltaic portion and one flap portion. The photovoltaic portion of one BIPV module may be aligned with the bottom photovoltaic portions of structures 502c and 502f, while the photovoltaic portion of another BIPV module may be aligned with the top photovoltaic portions of these same two structures.

FIG. 5B is a schematic illustration of another photovoltaic string 510 that includes two types of offset BIPV structures 512a-512g arranged around obstacle 514, in accordance with certain embodiments. Structures 512a-512c and 512e-512g have right-hand configurations, while structure 512d has a left-hand configuration. Structures 512a, 512b, 512c, and 512g are all vertically aligned with respect to each other (i.e., aligned in the Y direction) and form a row. However, another such structure cannot be positioned in between and aligned with respect to structures 512c and 512g without obstacle 514 interfering with a bottom photovoltaic portion of this other structure.

To fill the space between middle and top photovoltaic portions of structures 512c and 512g and, to a certain degree, to seal the building structure in this area from the environment, a left-handed structure 512d is positioned in that area. Left-hand structure 512d is shifted upward in the Y direction to prevent interference between its photovoltaic portions and obstacle 514. Specifically, the bottom photovoltaic portion of structure 512d is aligned with middle photovoltaic portions of structures 512c and 512g and the middle photovoltaic portion of structure 512d is aligned with the top photovoltaic portions of structures 512c and 512g. The different offset direction of the middle photovoltaic portion of structure 512d allows this structure to fit in between structures 512c and 512g with this vertical shifting.

Structures 512e and 512f are positioned in a different (lower) row with respect to structures 512a, 512b, 512c, and 512g. Photovoltaic portions of these structures in the two rows do not have any vertical interfaces (i.e., interfaces extending in the Y direction). In such situations, types of structures in one row are independent from types of structures in another row. In other words, the lower row that is shown to include two right-hand structures 512e and 512f may be formed using left-hand structures. Regardless of the structure types used to form this lower row, these BIPV structures provide at least some sealing of the building structure around obstacle 514.

A top photovoltaic portion of left-hand structure 512d extends above the row formed by structures 512a, 512b, 512c, and 512g. Therefore, another row formed above this row may accommodate this top photovoltaic portion and be positioned around this portion. In certain embodiments (not shown), two BIPV modules or one BIPV structure having only two photovoltaic portions are used to fill the space between BIPV structures 512c and 512g and above obstacle 514. In these embodiments, no photovoltaic portion may extend above the row formed by structures 512a, 512b, 512c, and 512g.

FIG. 5C is a schematic illustration of yet another photovoltaic string 520 including two types of offset BIPV structures 522a-522g arranged around two obstacles 524a and 524b, in accordance with certain embodiments. Structures 522a-522c are right-hand structures, while structures 522d-522g are left hand structures. Structures 522a, 522b, 522c, 522f, and 522g are all aligned with respect to each other in the Y direction and form a row. However, another right-hand structure cannot be positioned to the right (in the X direction) of structure 522c without interference from obstacles 524a and 524b. However, left-hand structure 522f can be positioned at this location such that the middle photovoltaic portions of right-hand structure 522c and left hand structure 522f are adjacent. Due to the different offset orientations of these structures, their bottom and top photovoltaic portions are not interfered with by obstacles 524a and 524b. Instead, obstacle 524a protrudes in between these photovoltaic portions. Similarly, another gap exists between the two bottom photovoltaic portions where obstacle 524b protrudes. The building structure in these gaps is protected by various flap portions of these two structures as well as other structures.

The row containing structures 522a-522c and 522f may be continued to the right of structure 522f with left hand-structures, such as structure 522g. In a similar manner, this row may be continued to the left of structure 522a with right-hand structures. Structures 522d and 522e are positioned in different rows than the row formed by structures 522a, 522b, 522c, 522f, and 522g such that photovoltaic portions of these three rows do not have vertical interfaces. Any types of structures may be used in these other two rows regardless of the arrangement in the middle row containing structures 522a-522c, 522f, and 522g.

Figure 5D:
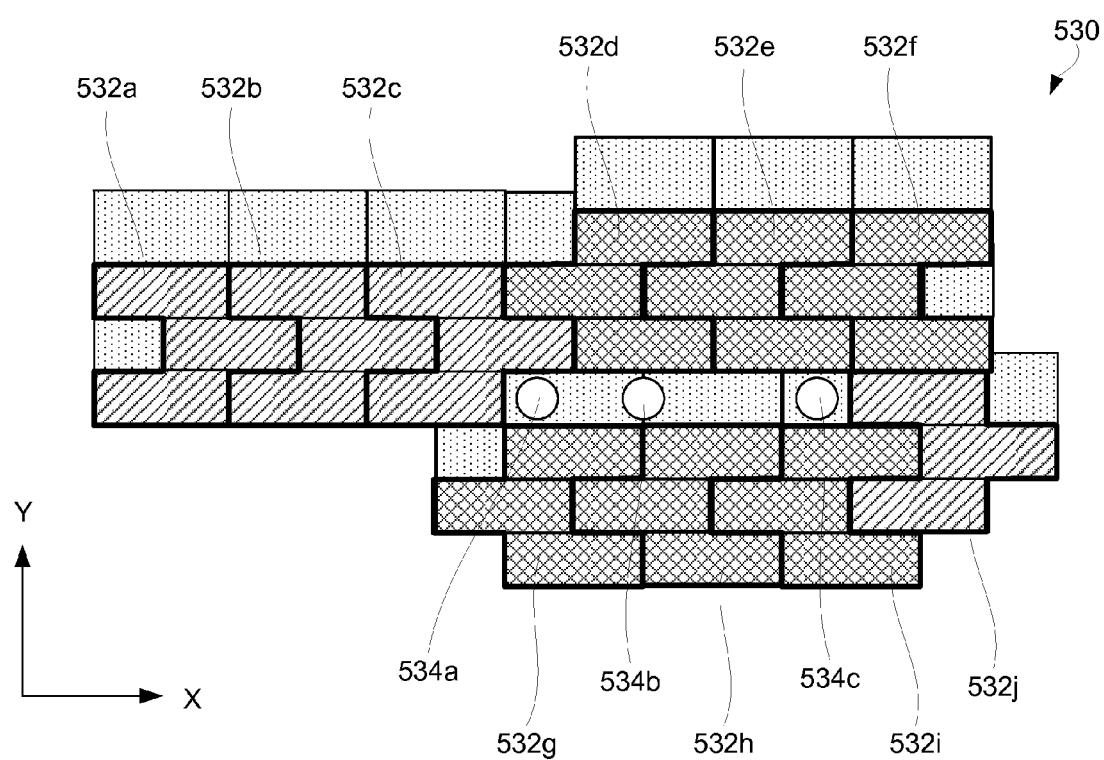

FIG. 5D is a schematic illustration of yet another photovoltaic string 530 including two types of offset BIPV structures 532a-532j arranged around three obstacles 534a, 534b, and 534c, in accordance with certain embodiments. Structures 532a-532c and 532j are right-hand structures, while structures 532d-532i are left-hand structures. Structures 532a, 532b, and 532c are aligned with respect to each other in the Y direction and form a row. However, other right-hand structures cannot be positioned to the right of structure 532c because obstacles 534a, 534b, and 534c would interfere with bottom photovoltaic portions of these right-hand structures. Instead, the row is continued with left-hand structures 532d, 532e, and 532f that are shifted upward (in the Y direction) with respect to structures 532a, 532b, and 532c, such that bottom photovoltaic portions of structures 532d, 532e, and 532f are aligned in the Y direction with the middle photovoltaic portions of structures 532a, 532b, and 532c. A separate lower row may be formed using any type of structures; in the example of FIG. 5D left-hand structures 532g-532i are used. When the bottom row clears obstacles 534a, 534b, and 534c, it may be shifted upwards using right-hand structure 532j such that that the bottom photovoltaic portion of structure 532*j* is aligned in the Y direction with the middle photovoltaic portions of structures 532*g*, 532*h*, and 532*i*.

Photovoltaic cells of two adjacent BIPV modules or BIPV structures described above often do not need be interconnected. For example, these modules or structures may belong to different photovoltaic strings. Electrical power generated by the corresponding photovoltaic cells in each string is transferred using separate sets of wires, which are connected to their respective inverters or other components of the photovoltaic array. It is often desirable to make electrical connections to different strings in the same location of the array. This can be done by extending multiple lines from different strings into that location.

Provided are building integrable photovoltaic assemblies having photovoltaic modules or structures with attached or otherwise integrated multi-conductor return lines. A multi-conductor return line includes two or more bus bars extending between opposite edges of the modules or structures and electrically disconnected, at least prior to installation, from photovoltaic cells of these modules or structures. During installation, one of these bus bars may be attached to one contact point of the photovoltaic cells and used as a return line for this module or structure. Another bus bar may be used as a return line for another module or structure, for example, an adjacent module or structure. In certain embodiments, one bus bar in the multi-conductor return line may be shared by two or more modules or structures. For example, one bus bar may be used as one lead common to multiple strings. Other leads may be individual to each string and provided by other bus bars of the multi-conductor return line. In other example, each string has a dedicated set of two leads. For clarity, the following description refers to multi-conductor return lines attached to photovoltaic modules. However, BIPV structures may also include multi-conductor return lines in a manner similar to the modules.

Figure 6A:
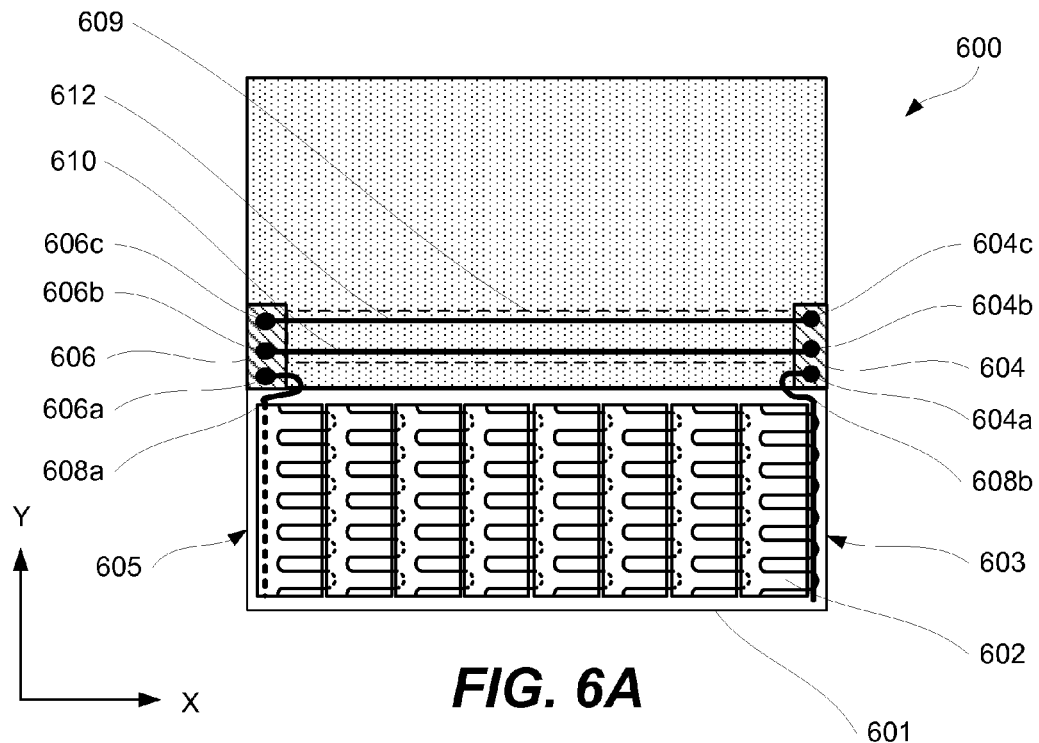
FIG. 6A is a schematic illustration of a BIPV assembly having a multi-conductor return line with two bus bars, in accordance with certain embodiments.

FIG. 6A is a schematic illustration of a BIPV assembly 600 having a multi-conductor return line 609 with two bus bars 610 and 612, in accordance with certain embodiments. BIPV assembly 600 includes a photovoltaic module 601 that has a front side (i.e., the light facing side) and a back side (i.e., the building structure facing side). Photovoltaic module 601 includes one or more photovoltaic cells 602 disposed along the front side and having two contact points 608*a* and 608*b* for making electrical connections to the cells and transmitting electrical power from the cells. Contact points 608*a* and 608*b* represent different polarity connections to the cells. Specifically, contact point 608*a* is shown connected to the back side of the left-most photovoltaic cell, while contact point 608*b* is shown connected to the front side of the right-most photovoltaic cell. When a photovoltaic module includes multiple cells, these cells may be interconnected such that only two contact points are needed in the module.

Photovoltaic module 601 has a first edge 603 and a second edge 605. These edges are defined by the front side and the back side of the module. First edge 603 and second edge 605 are shown extending in the Y direction. Furthermore, these edges define the length of photovoltaic module 601, which extends in the X direction. When BIPV assembly 600 is installed in a row adjacent to two other BIPV assemblies, first edge 603 faces one of these two BIPV assemblies, while second edge 605 will face another one. Therefore, these edges correspond to the interfaces between adjacent BIPV assemblies in the same row and correspond to electrical connections provided at these interfaces.

Multi-conductor return line 609 is shown with two bus bars 610 and 612. In other examples, a multi-conductor return line may include three or more bus bars. Having multiple bus bars in multi-conductor return lines provides additional interconnection functionalities not previously available in a typical BIPV module, which includes only one bus bar and can provide only one return line through the module. Therefore, the typical BIPV module cannot be used for providing separate electrical connections to a photovoltaic string that this module is not a part of. To the contrary, BIPV assemblies described herein allow multiple return paths as further described with reference to FIGS. 7A and 7B.

Two bus bars 610 and 612 of multi-conductor return line 609 extend between first edge 603 and second edge 605. Prior to installation, these bus bars are electrically disconnected from two contact points 608*a* and 608*b* of photovoltaic cells 602. In order to make electrical connections to these bus bars and contact points, BIPV assembly includes two module connectors 604 and 606. First module connector 604 is provided along first edge 603, while second module connector 606 is provided along second edge 605. Module connectors may be positioned at any location along these edges. For example, a module connector may be positioned in the moisture flap portion of the module or its photovoltaic portion. In certain embodiments, a module connector is positioned at the interface of the photovoltaic and moisture flap portions. A module connector may be positioned flush with the edge or it may be positioned away from the edge, such as within the photovoltaic module boundary or outside of such boundary. In certain embodiments, a module connector is positioned adjacent to the back side of the module to protect the connector and any connections made by this connector from the environment.

In certain embodiments, a module connector includes three conductive elements, one of which is electrically connected to a corresponding contact point of the photovoltaic cells, while the other two conductive elements are separately connected each of the two bus bars. FIG. 6A illustrates first module connector 604 including conductive elements 604*a*, 604*b*, and 604*c*, and second module connector 606 including conductive elements 606*a*, 606*b*, and 606*c*. Conductive element 604*a* is connected to photovoltaic cells 602 using one contact point 608*b*. In a similar manner, conductive element 606*a* is connected to photovoltaic cells 602 using another contact point 608*a*. Conductive elements 604*b* and 606*b* are connected to bus bar 610 at their respective edges and, therefore, are interconnected by this bus bar. Neither conductive elements 604*b* and 606*b* nor bus bar 610 is connected to photovoltaic cells 602 at least prior to installation of BIPV assembly 600. In a similar manner, conductive elements 604*c* and 606*c* are connected to bus bar 612 at their respective edges and, therefore, are interconnected by this bus bar. Likewise, neither conductive elements 604*c* and 606*c* nor bus bar 612 is connected to photovoltaic cells 602 at least prior to installation. During installation one of these bus bars may be connected to contact point 606*a* or contact point 604*a* to provide return line for BIPV assembly 600. This type of connection is described below with reference to FIGS. 7A and 7B.

Figure 6B:
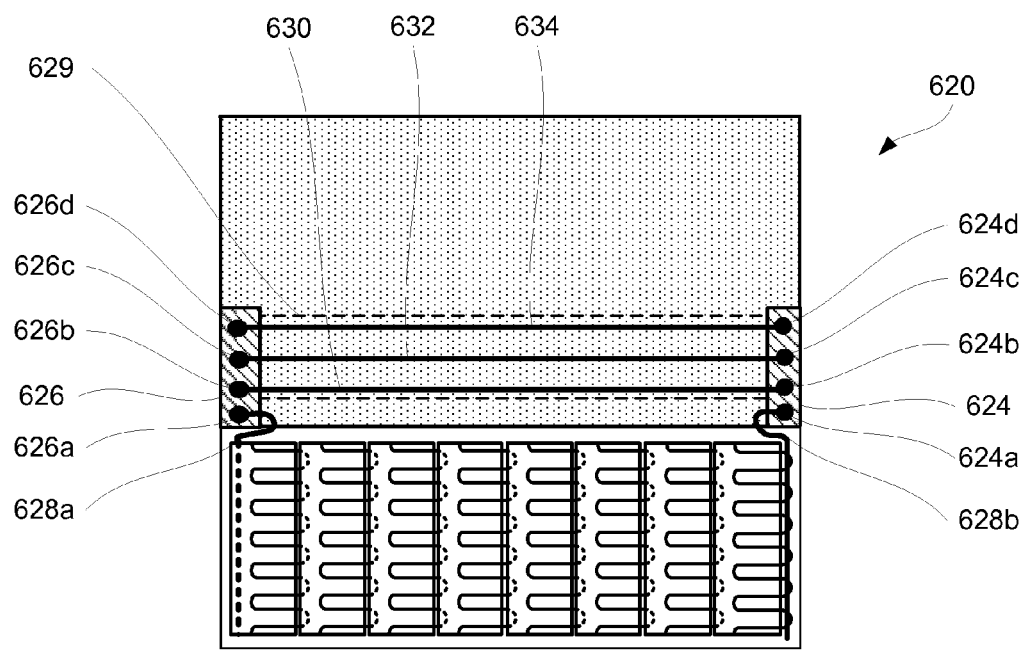
FIG. 6B is a schematic illustration of another BIPV assembly having a different multi-conductor return line with three bus bars, in accordance with different embodiments.

FIG. 6B is a schematic illustration of a BIPV assembly 620 having a multi-conductor return line 629 with three bus bars 630, 632, and 634, in accordance with certain embodiments. In this examples, each module connector has four conductive elements, i.e., module connector 624 has conductive elements 624*a*, 624*b*, 624*c*, and 624*d*, while module connector 624 has conductive elements 626*a*, 626*b*, 626*c*, and 626*d*. The bottom three conductive elements are connected in a manner similar to the one described above with reference to FIG. 6A, i.e., conductive elements 626a and 624a are connected to contact points 628a and 628b, respectively, while conductive elements 626b and 624b are interconnected with bus bar 630 and conductive elements 626c and 624c are interconnected with bus bar 632. The fourth set of conductive elements 626d and 624d is interconnected with bus bar 634 and provides additional return line that is not available in the example shown in FIG. 6A. Therefore, BIPV assembly 620 shown in FIG. 6B can provide three separate return lines, while BIPV assembly 610 shown in FIG. 6A can provide only two separate return lines.

In general, a BIPV assembly may include two or more bus bars each representing a separate return line when the BIPV assembly is installed and becomes a part of an array. Some examples of BIPV assemblies include three bus bars, four bus bars, five bus bars, six bus bars, and so on. At least one of these bus bars may be used as a return line for the BIPV assembly itself. Additional bus bars may be used as return lines for other BIPV assemblies that are not interconnected into a string with the BIPV module providing these bur bars. Multiple BIPV assemblies or, more specifically, multiple photovoltaic strings, may share one return line with other modules as further explained below with reference to FIG. 7A. Still, each string may have another lead connected to a dedicated return line. In other embodiments, each string has two dedicated return lines as further described below with reference to FIG. 7B.

Figure 7A:
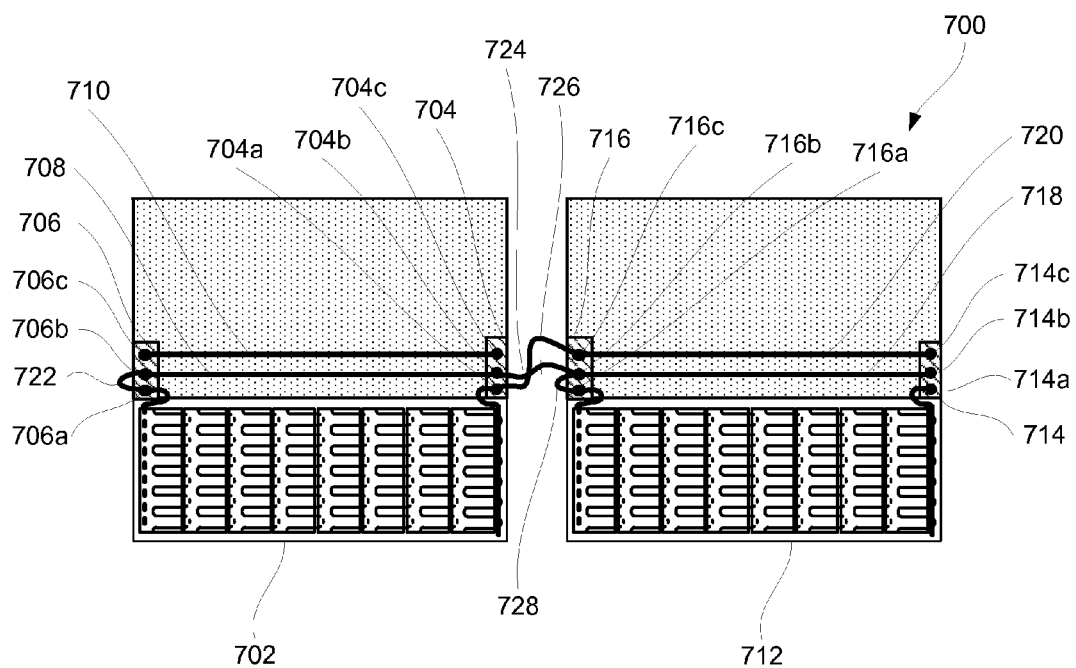
FIG. 7A is a schematic illustration of two interconnected BIPV assemblies such that the left assembly provides a partially shared return line to the right assembly, in accordance with certain embodiments.

FIG. 7A is a schematic illustration of two interconnected BIPV assemblies 702 and 712 such that left assembly 702 provide return line to right assembly 712, in accordance with certain embodiments. BIPV assemblies 702 and 712 are similar to the assembly described above with reference to FIG. 6A in that each assembly includes only two bus bars. Specifically, BIPV assembly 702 includes left module connector 706 that has three conductive elements 706a, 706b, and 706c and right module connector 704 that has three conductive elements 704a, 704b, and 704c. Conductive elements 706a and 704a are connected to contact points of the photovoltaic cells, while conductive elements 706b and 704b are interconnected with bus bar 708 and conductive elements 706c and 704c are interconnected with bus bar 710. BIPV assembly 712 includes left module connector 716 that has three conductive elements 716a, 716b, and 716c and right module connector 714 that has three conductive elements 714a, 714b, and 714c. Conductive elements 716a and 714a are connected to contact points of the photovoltaic cells, while conductive elements 716b and 714b are interconnected with bus bar 718 and conductive elements 716c and 714c are interconnected with bus bar 720.

During installation conductive elements 706a and 706b can be interconnected with each other using, for example, jumper 722. This connection turns bus bar 708 into a return line for BIPV assembly 702. Conductive elements 706c and 704c and bus bar 710 of this assembly can remain unconnected after installation and not used for conducting electrical current. In certain embodiments, a BIPV assembly having such electrical connections may be replaced with a conventional BIPV module. However, to reduce a number of different BIPV components used during installation, a BIPV assembly with one or more disconnected bus bars may be used as shown in this document.

Also during installation conductive elements 716a and 716b are interconnected with each other using, for example, jumper 728. Therefore, bus bar 718 becomes a return line for BIPV assembly 712. Installation also involves interconnecting conductive elements 704a and 716c and, separately, interconnecting conductive elements 704b and 716b. These connections may be provided by, for example, joiner connectors 724 and 726. These joiner connectors may be integrated into the same component and, in certain embodiments, include jumper 728. These connections result in interconnecting bus bar 708 with bus bar 718 such that bus bar 718 serves as a shared return line for assemblies 702 and 712. At the same time, bus bar 720 is a second return line dedicated to assembly 702 only. A bus bar shared by multiple assemblies may have a correspondingly larger cross-sectional diameter than a bus bar dedicated to one assembly, e.g., twice larger when a bus bar shared by two assemblies. A pair of conductive elements 714a and 714b represent both contact points of assembly 712, while a pair of conductive elements 714b and 714c represent both contact points of assembly 702.

If sharing a bus bar by two or more BIPV assemblies is now desirable, then each BIPV assembly or a photovoltaic string may have a dedicated pair of bus bars in each assembly used to form return lines. This example with now be explained with reference to FIG. 7B.

Figure 7B:
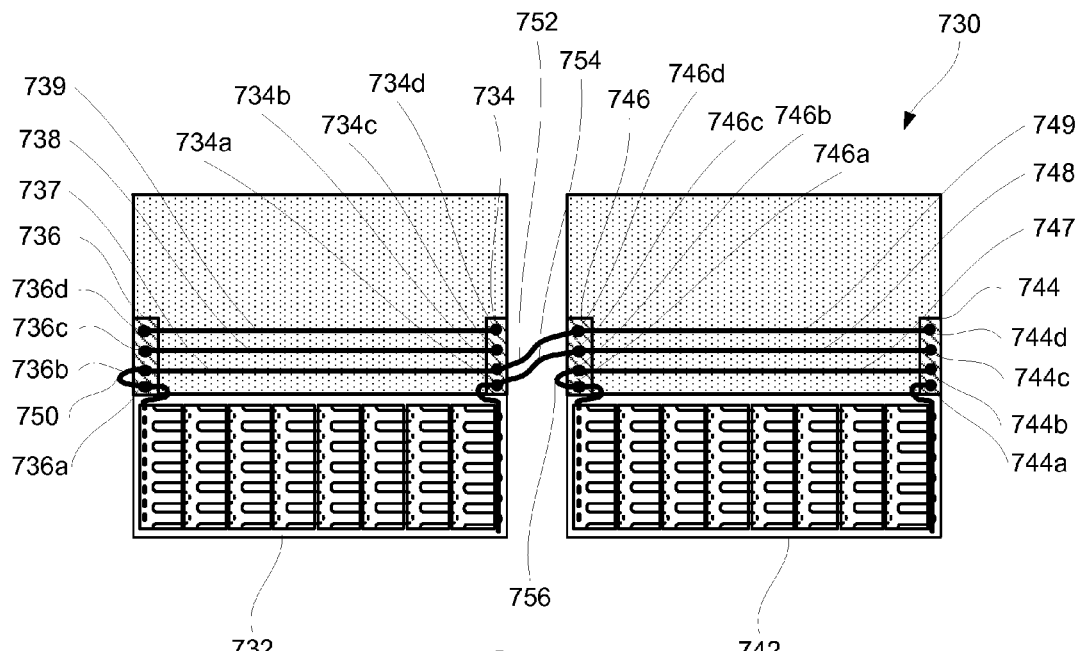
FIG. 7B is a schematic illustration of two other interconnected BIPV assemblies such that the left assembly provides a separate return line to the right assembly, in accordance with different embodiments.

FIG. 7B is a schematic illustration of two other interconnected BIPV assemblies 732 and 742 such that left assembly 732 provides two separate return lines to right assembly 742, in accordance with different embodiments. BIPV assemblies 732 and 742 are similar to the assembly described above with reference to FIG. 6B with each having three bus bars. Specifically, BIPV assembly 732 includes left module connector 736 that has four conductive elements 736a, 736b, 736c, and 736d and right module connector 734 that has four conductive elements 734a, 734b, 734c, and 734d. Conductive elements 736a and 734a are connected to contact points of the photovoltaic cells, while conductive elements 736b and 734b are interconnected with bus bar 737, conductive elements 736c and 734c are interconnected with bus bar 738, and conductive elements 736d and 734d are interconnected with bus bar 739. Likewise, BIPV assembly 742 includes left module connector 746 that has four conductive elements 746a, 746b, 746c, and 746d and right module connector 744 that has four conductive elements 744a, 744b, 744c, and 744d. Conductive elements 746a and 744a are connected to contact points of the photovoltaic cells, while conductive elements 746b and 744b are interconnected with bus bar 747, conductive elements 746c and 744c are interconnected with bus bar 748, and conductive elements 746d and 744d are interconnected with bus bar 749.

During installation, conductive elements 736a and 736b are interconnected with each other using, for example, jumper 750. As such, bus bar 737 becomes a return line for BIPV assembly 732. Conductive elements 736c and 734c and bus bar 734 as well as conductive elements 736d and 734d and bus bar 739 of this assembly remain unconnected after installation and are not used for conducting electrical current.

In a similar manner, during installation conductive elements 746a and 746b are interconnected with each other using, for example, jumper 756. Bus bar 747 becomes a return line for BIPV assembly 742. Furthermore, during installation conductive elements 734a and 746c are interconnected and, separately, elements 734b and 746d are interconnected. These connections are may be provided by joiner connectors 752 and 754. As such, bus bars 748 and 749 serve as return lines for assembly 732, while bus bar 747 serves as a return line for assembly 742. A pair of conductive elements 744a and 744b represent both contact points of assembly 742, while a pair of conductive elements 744c and 744d represent both contact points of assembly 732. In this example, assemblies 732 and 742 do not share bus bars or conductive elements of assembly 742.

Figure 8A:
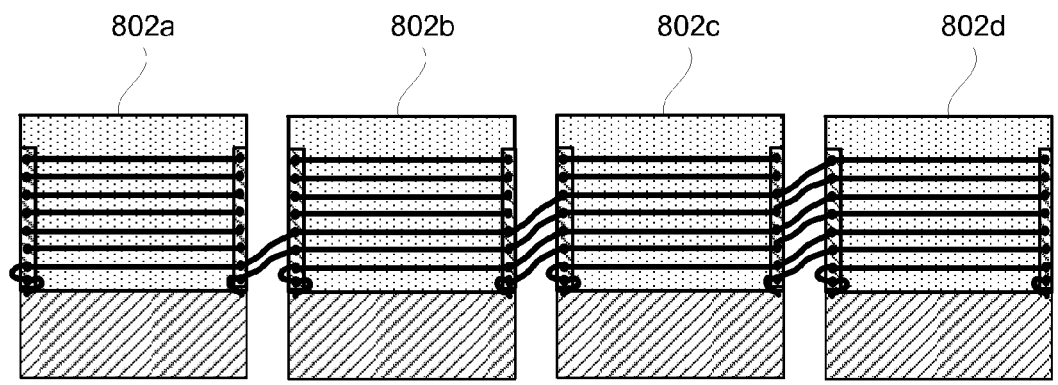
FIG. 8A illustrates four interconnected BIPV assemblies such that the right assembly provides four separate return lines corresponding to each one of these assemblies, in accordance with certain embodiments.

Bus bars of a multi-conductor return line may be used for separately delivering power from multiple different strings as, for example, shown in FIG. 8A. Each one of BIPV assemblies 802a-802d has seven bus bars. Assembly 802a uses only one bus bar for providing its own return line. Six remaining bus bars are not used. Assembly 802b also uses one bus bar for providing its own return line, but it also uses two additional bus bars for providing return lines to assembly 802a. Four remaining bus bars are not used. Assembly 802c uses one bus bar for providing its own return line, two additional bus bars are used for providing return lines for assembly 802a, and two more bus bars for providing return bath for assembly 802b. Two remaining bus bars are not used. Finally, assembly 802d uses one bus bar for providing its own return line, two additional bus bars for providing return lines for assembly 802a, two more bus bars for providing return lines for assembly 802b, and finally two more bus bars for providing return lines bar for assembly 802c. All seven bus bars are used. The right module connector of assembly 802d has four pairs of conductive elements, each pair corresponding to a different assembly.

Figure 8B:
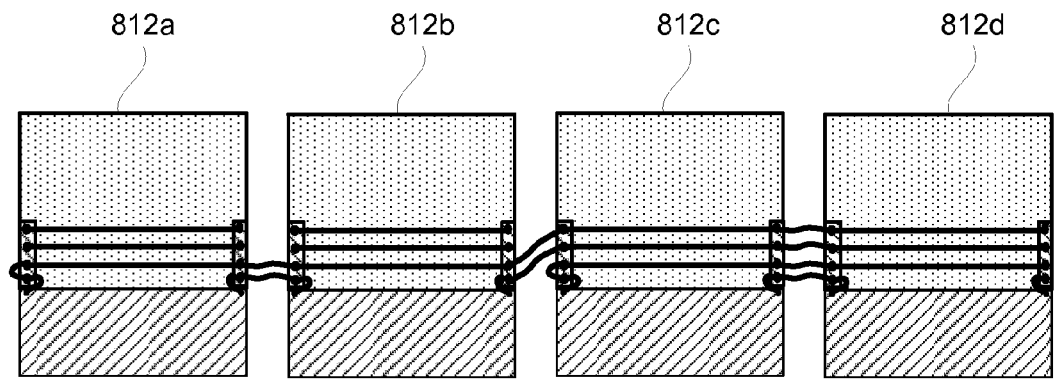
FIG. 8B illustrates four interconnected BIPV assemblies forming two photovoltaic strings such that the right two assemblies provide a return line for both photovoltaic strings, in accordance with certain embodiments.

Furthermore, bus bars of a multi-conductor return line may be used for interconnecting BIPV assemblies within a photovoltaic string. FIG. 8B illustrates four assemblies 812a-812d interconnected into two photovoltaic strings, in accordance with certain embodiments. Specifically, one string includes assemblies 812a and 812b, while another string includes assemblies 812c and 812d. The return line within the first string is provided by one of the bus bars in assemblies 812a and 812b. Bus bars of assemblies 812c and 812d provide return line for the second string as well as a separate return line for the first string.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A building integrable photovoltaic assembly comprising:
   a photovoltaic module, comprising:
      a front side,
      a back side,
      one or more photovoltaic cells disposed along the front side,
      a first contact point,
      a second contact point, and
      a first edge and a second edge formed by the front side and the back side, defining a length of the photovoltaic module and defining boundaries of the photovoltaic module;
   a multi-conductor return line, comprising:
      a first bus bar that extends between the first edge and the second edge, and
      a second bus bar that extends between the first edge and the second edge;
   a first module connector provided along the first edge and comprising:
      a first conductive element,
      a second conductive element, and
      a third conductive element; and
   a second module connector provided along the second edge and comprising:
      a fourth conductive element,
      a fifth conductive element, and
      a sixth conductive element; wherein:
         the first conductive element is electrically connected to the first contact point,
         the fourth conductive element is electrically connected to the second contact point,
         the first bus bar is electrically connected to the second conductive element and the fifth conductive element,
         the second bus bar is electrically connected to the third conductive element and the sixth conductive element,
         at least two of the first, second, third, fourth, fifth, and sixth conductive elements are configured to make a direct physical and electrical connection with a conductive element of another photovoltaic module,
         the first conductive element, the second conductive element, and the third conductive element are electrically insulated from each other,
         the fourth conductive element, the fifth conductive element, and the sixth conductive element are electrically insulated from each other, and
         the first module connector and second module connector are wholly within the boundaries defined by the first edge and the second edge.

2. The building integrable photovoltaic assembly of claim 1, wherein:
   the first module connector further comprises a seventh conductive element,
   the second module connector further comprises an eighth conductive element,
   the multi-conductor return line further comprises a third bus bar that extends between the first edge and the second edge,
   the third bus bar is electrically connected to the seventh conductive element and the eighth conductive element,
   the seventh and eighth conductive elements are configured to make a direct physical and electrical connection with a conductive element of another photovoltaic module,
   the seventh conductive element is electrically insulated from the first conductive element, the second conductive element, and the third conductive element, and
   the eighth conductive element is electrically insulated from the fourth conductive element, the fifth conductive element, and the sixth conductive element.

3. The building integrable photovoltaic assembly of claim 1, wherein the multi-conductor return line is removably attached to the photovoltaic module.

4. The building integrable photovoltaic assembly of claim 1, wherein the first bus bar has a cross-sectional area at least about twice greater than a cross-sectional area of the second bus bar, or the second bus bar has a cross-sectional area at least about twice greater than a cross-sectional area of the first bus bar.

5. The building integrable photovoltaic assembly of claim 1, wherein the first bus bar and the second bus bar have substantially the same cross-sectional areas.

6. The building integrable photovoltaic assembly of claim 1, wherein the first bus bar and the second bus bar are insulated by a shared insulation sheath.

7. The building integrable photovoltaic assembly of claim 1, wherein the photovoltaic module comprises a photovoltaic portion and a moisture flap portion, and wherein the multi-conductor return line is positioned in the moisture flap portion.

* * * * *